(12) United States Patent
Phillps et al.

(10) Patent No.: US 8,932,702 B2
(45) Date of Patent: Jan. 13, 2015

(54) LOW K DIELECTRIC

(75) Inventors: Mark L. F. Phillps, Albuquerque, NM (US); Travis P. S. Thoms, Bosque Farms, NM (US)

(73) Assignee: SBA Materials, Inc., Albuquerque, NM (US)

( * ) Notice: Subject to any disclaimer, the term of this patent is extended or adjusted under 35 U.S.C. 154(b) by 425 days.

(21) Appl. No.: 12/157,830

(22) Filed: Jun. 13, 2008

(65) Prior Publication Data

US 2009/0017272 A1 Jan. 15, 2009

Related U.S. Application Data

(60) Provisional application No. 60/934,725, filed on Jun. 15, 2007.

(51) Int. Cl.
*B32B 3/26* (2006.01)
*H01L 21/02* (2006.01)
*H01L 21/312* (2006.01)

(52) U.S. Cl.
CPC ...... *H01L 21/3121* (2013.01); *H01L 21/02203* (2013.01); *H01L 21/02123* (2013.01); *H01L 21/02348* (2013.01); *H01L 21/02282* (2013.01)
USPC .................. 428/195.1; 428/304.4; 252/299.6; 438/778

(58) Field of Classification Search
USPC ....................................... 428/220
See application file for complete search history.

(56) References Cited

U.S. PATENT DOCUMENTS

| | | | |
|---|---|---|---|
| 4,460,478 A | 7/1984 | Mohr et al. | |
| 5,622,684 A | 4/1997 | Pinnavaia et al. | |
| 6,054,111 A | 4/2000 | Antonietti et al. | |
| 6,274,515 B1 | 8/2001 | Hughes et al. | |
| 6,630,406 B2 * | 10/2003 | Waldfried et al. | ............ 438/710 |
| 6,919,636 B1 * | 7/2005 | Ryan | ............................ 257/751 |
| 7,176,245 B2 | 2/2007 | Stucky et al. | |
| 7,611,731 B2 | 11/2009 | Wyrsta et al. | |
| 2002/0045693 A1 | 4/2002 | Hayashi et al. | |
| 2005/0089642 A1 | 4/2005 | Adams et al. | |

(Continued)

FOREIGN PATENT DOCUMENTS

| | | |
|---|---|---|
| EP | 1376671 A1 | 1/2004 |
| WO | WO 2006043438 A1 * | 4/2006 |

OTHER PUBLICATIONS

"Ionization Constants of Organic Acids." Organic Chemisty Michigan State University, n.d. Web. Feb. 25, 2013.*
Jan. 5, 2012 Office Action issued n U.S. Appl. No. 13/010,573.

(Continued)

*Primary Examiner* — Maria Veronica Ewald
*Assistant Examiner* — Laura Auer
(74) *Attorney, Agent, or Firm* — Berliner & Associates

(57) ABSTRACT

A spin-on dielectric of novel composition formed as a sol comprising an a source of silicon such as an orthosilicate ester, alone or in combination with an alkylated orthosilicate ester, a polar solvent, water, an acid catalyst, which may be a strong acid catalyst, and an amphiphilic block copolymer surfactant, optionally including an organic acid, a co-solvent and/or a reactive solvent. Also provided is a method of formulating the sol, a film made from the spin-on dielectric that has desirable electrical and mechanical properties, methods for treating the film described to optimize the film's electrical and mechanical performance, and methods for depositing the film onto silicon, steel or other surfaces.

29 Claims, 17 Drawing Sheets

(56) References Cited

U.S. PATENT DOCUMENTS

| | | |
|---|---|---|
| 2005/0196974 A1 | 9/2005 | Kirner et al. |
| 2005/0214674 A1* | 9/2005 | Sui et al. .................... 430/270.1 |
| 2006/0006541 A1 | 1/2006 | Tsuchiya et al. |
| 2006/0078676 A1 | 4/2006 | Lukas et al. |
| 2006/0216952 A1 | 9/2006 | Bhanp et al. |
| 2006/0249818 A1 | 11/2006 | Peterson et al. |
| 2006/0276041 A1 | 12/2006 | Uchikura et al. |
| 2007/0099005 A1 | 5/2007 | Leung et al. |
| 2008/0011987 A1* | 1/2008 | Arao et al. .................... 252/573 |

OTHER PUBLICATIONS

Amendment filed Jul. 25, 2014 in related U.S. Appl. No. 13/010,573.

Advisory Action dated Aug. 26, 2014 and issued in related U.S. Appl. No. 13/010,573.

\* cited by examiner

LOW K DIELECTRIC

CROSS-REFERENCE TO RELATED APPLICATIONS

This application claims the benefit of the Provisional U.S. Patent Application Ser. No. 60/934,725 filed Jun. 15, 2007 which is incorporated for reference in its entirety.

FIELD OF THE INVENTION

The invention relates to dielectrics having a low dielectric constant, methods for formulating them, forming films made from the dielectrics and depositing and treating the films, for example by spin-on methods, spray coating, dip coating, draw coating, and inkjet printing.

BACKGROUND OF THE INVENTION

One property of dielectric materials is the dielectric constant. For certain purposes it is desirable to use materials with low dielectric constants. The manufacture of interlayer dielectric semiconductor thin films is typically carried out by first depositing the desired thin film on a surface such as a semiconductor substrate. One common method of depositing thin films is by spin-on deposition. During spin-on deposition, a solution of precursor for the thin film is applied to a semiconductor wafer, and either during deposition or thereafter the wafer is rotated at sufficiently high speed (rapid spinning step) to thin and even the layer of precursor solution. During and after the rapid spinning step, the solvents are permitted to evaporate, leaving a dried film of dielectric material. However, typically, some of the commonly used dielectric materials require subsequent processing, including curing the thin film at high temperature. The high temperature curing step can condense or cross-link the precursor molecules together, making a tighter, stronger film with a low dielectric constant. Additionally, the curing step frequently serves to "crack" a polymeric porogen into more volatile chemical fragments that vaporize to create pores or voids in the cured film, thus reducing dielectric constant. The curing step can be performed in a furnace using only thermal energy. Alternatively, films may be cured simultaneously heating and exposing to UV light. They may also be cured via electron beam irradiation.

This invention describes a series of techniques for making porous dielectric films with an exceptional range of k values (1.3-3.0), an expanded Young's modulus vs. k envelope, excellent CTE match with silicon and copper, low film stress, and low crack propagation rates, that are curable at reduced temperatures compared with other porous dielectrics. These characteristics arise from a combination of improvements in the composition of the solutions used to prepare the films and improvements in the techniques used to process the films. Most significantly, these films can be processed with very short bake and cure times, which significantly reduces overall process times and enhances device production rate.

Current techniques for preparing porous dielectric films are deficient in at least one of the elements specified above. Notably, CTE mismatch between the dielectric film and copper has caused failures during processing: a ULSI device made using a dual damascene process can contain 11 layers or greater, and the repeated temperature cycling needed to cure successive layers causes-failures related to cracking and delamination. More significantly, ULSI devices will require incrementally finer wire size and pitch in order to increase transistor density and devices built at a node size of 32 nm or smaller will require dielectrics with k values less than 2.2 to prevent crosstalk and capacitance loss. In addition, semiconductor manufacturers desire cure temperatures less than 400 C to protect thermally sensitive components. Furthermore, a substantial number of spin-on porous dielectric films are sensitive to ambient moisture and must be handled in dry conditions to prevent hydrolysis with a concomitant increase in k and susceptibility to cracking.

Another common method for depositing dielectric films is chemical vapor deposition (CVD). This process requires very expensive equipment. Also, it is best suited for producing films with dielectric constant (k) in the range of 2.5 to 3. The effective dielectric constant is generally higher than the CVD dielectric due to adhesion and capping layers required to meet the application requirements. CVD films with lower k values suffer problems related to mechanical stability such as poor adhesion or delamination, high film stress, unacceptable crack propagation rate, and/or low Young's modulus. In addition, it appears very difficult to make CVD films with k values less than 2.3, while the films in this invention have k values between 1.3 and 3.0. Moreover, the films in this invention have superior mechanical properties at a particular dielectric constant between 1.3 and 2.6 vs. CVD and other spin-on films (as determined through measurements of modulus and crack propagation) and have improved hydrolytic stability.

Therefore, compositions are needed that enable rapid, efficient curing of spin-on thin films, while maintaining a low dielectric constant, high dielectric strength, low loss tangent, and high mechanical strength.

More specifically, the dielectric constant of an insulating thin film is only one of many attributes required for making a film that will perform properly in a semiconductor device. Films must also be mechanically robust, both to survive the chemical-mechanical polish (CMP) step and inhibit crack propagation. In addition the films must be resistant to damage from ashing during post-CMP cleanup, and must be resistant to attack from atmospheric moisture. The conventional CVD materials have limitations for ULK dielectrics with both properties. Furthermore, the coefficient of thermal expansion (CTE) of the film should be close to the CTEs of copper and silicon, the pores (if any) in the dielectric must be small (5 nm or less) to avoid copper migration, and outgassing of the film during subsequent thermal processing should be minimal. The optimum cure temperature will depend on the application, since some devices will require lower cure temperatures than others. It will also depend on the type of surfactant used, film thickness, atmosphere during cure, time available for cure, and desired electrical and mechanical properties. Most films will be cured at temperatures between 250 and 500° C., more preferably temperatures between 350 and 425° C.

It is generally assumed that the Young's modulus of the film is indicative of CMP resistance and rate of crack propagation, and this invention is guided by this assumption. It is possible that fracture toughness is a more reliable indicator of mechanical robustness than modulus. Notwithstanding this, it is the goal of this invention to produce films that have an expanded modulus vs. dielectric constant or E-k envelope, that is, have increased Young's moduli at a particular value of k compared with prior art. It is a further goal is this invention to produce films with acceptable mechanical and electrical properties after curing at temperatures below 400° C.

BRIEF SUMMARY OF THE INVENTION

The present invention overcomes the foregoing drawbacks by providing a spin-on dielectric of novel composition.

In one embodiment, a fluid colloidal solution is provided comprising a silica source, a polar solvent, water, an acid catalyst and an amphiphilic block copolymer surfactant.

In a more particular embodiment, a sol (also referred to as a hydrosol), is provided comprising an orthosilicate ester, alone or in combination with an alkylated orthosilicate ester, a polar solvent, water, an acid catalyst, and an amphiphilic block copolymer surfactant.

In another embodiment, the above fluid colloidal solutions further comprise of a second cosolvent, which may be polar or nonpolar, and an additional acid in the form of an organic acid.

A method of formulating a low dielectric film is also provided comprising combining a silica source, polar solvent, water, acid catalyst, polymer surfactant, and cosolvent.

In another embodiment, a method of formulating a low dielectric film is provided by combining a silica source with a polar solvent to form a part A; separately combining water, an acid catalyst, and a polymer surfactant with a polar solvent to form a part B; and mixing part A and part B to form a fluid colloidal solution.

In one embodiment, a method for preparing a low dielectric film, is provided comprising combining a silica source with a polar solvent to form a part A; separately combining water, an acid catalyst, and a polymer surfactant with a polar solvent to form a part B; mixing part A and part B to form a fluid colloidal solution; and depositing the fluid colloidal solution onto a surface under conditions whereby to form a low dielectric film.

In other embodiments, dielectric films formed by the above processes are provided.

In one embodiment, a dielectric film is provided comprising a metal or non-metal oxide comprising M-O bonds, wherein the M-O bonds are partially replaced with M-R bonds, wherein M is a metal, O is oxygen, R is an alkyl or aryl group, and a amphiphilic block copolymer template that can be removed by the action of heat.

Also methods for thermally and/or chemically treating the spun sol prior to anneal, and conditions of anneal (e.g., atmosphere, UV illumination) are provided.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
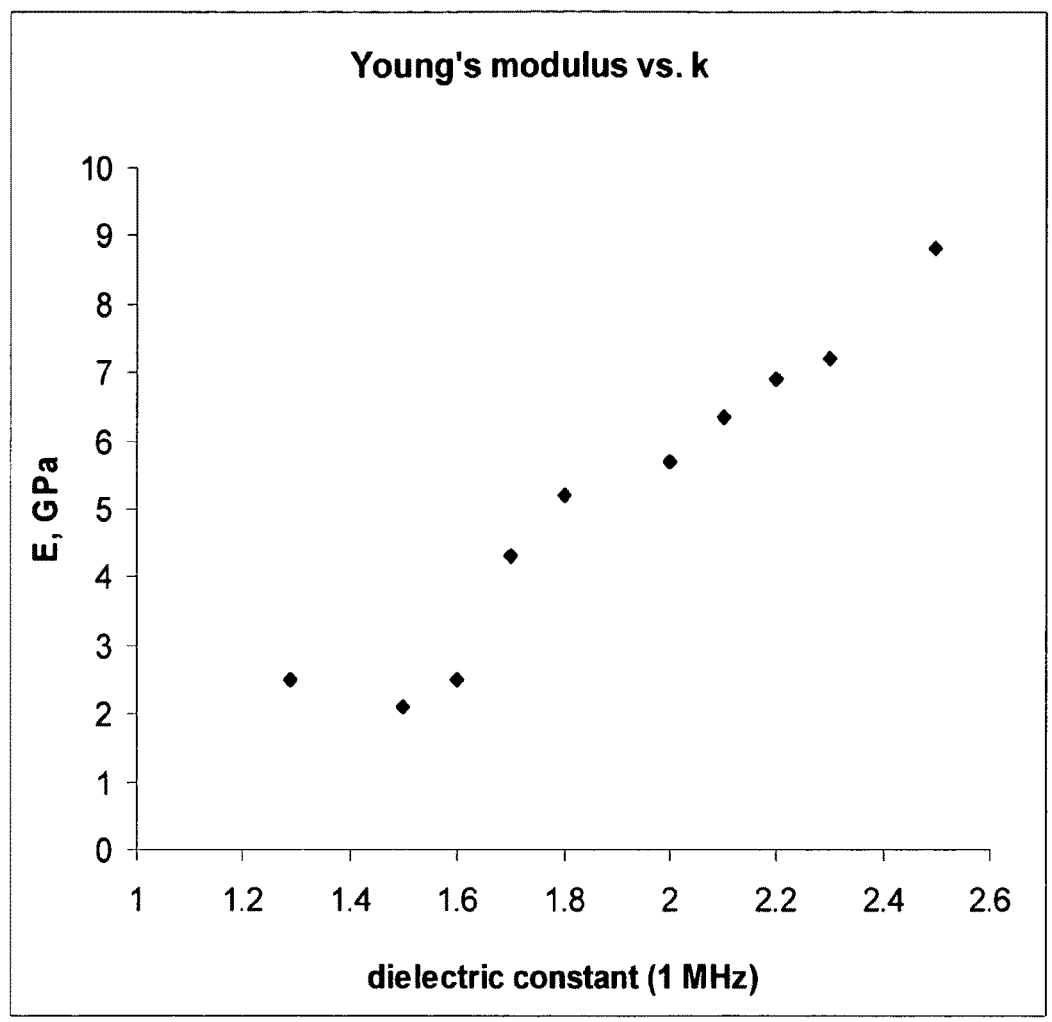
FIG. 1 shows the locus of maximum Young's modulus at a particular value of dielectric constant in the films described in this invention.
Figure 2A:
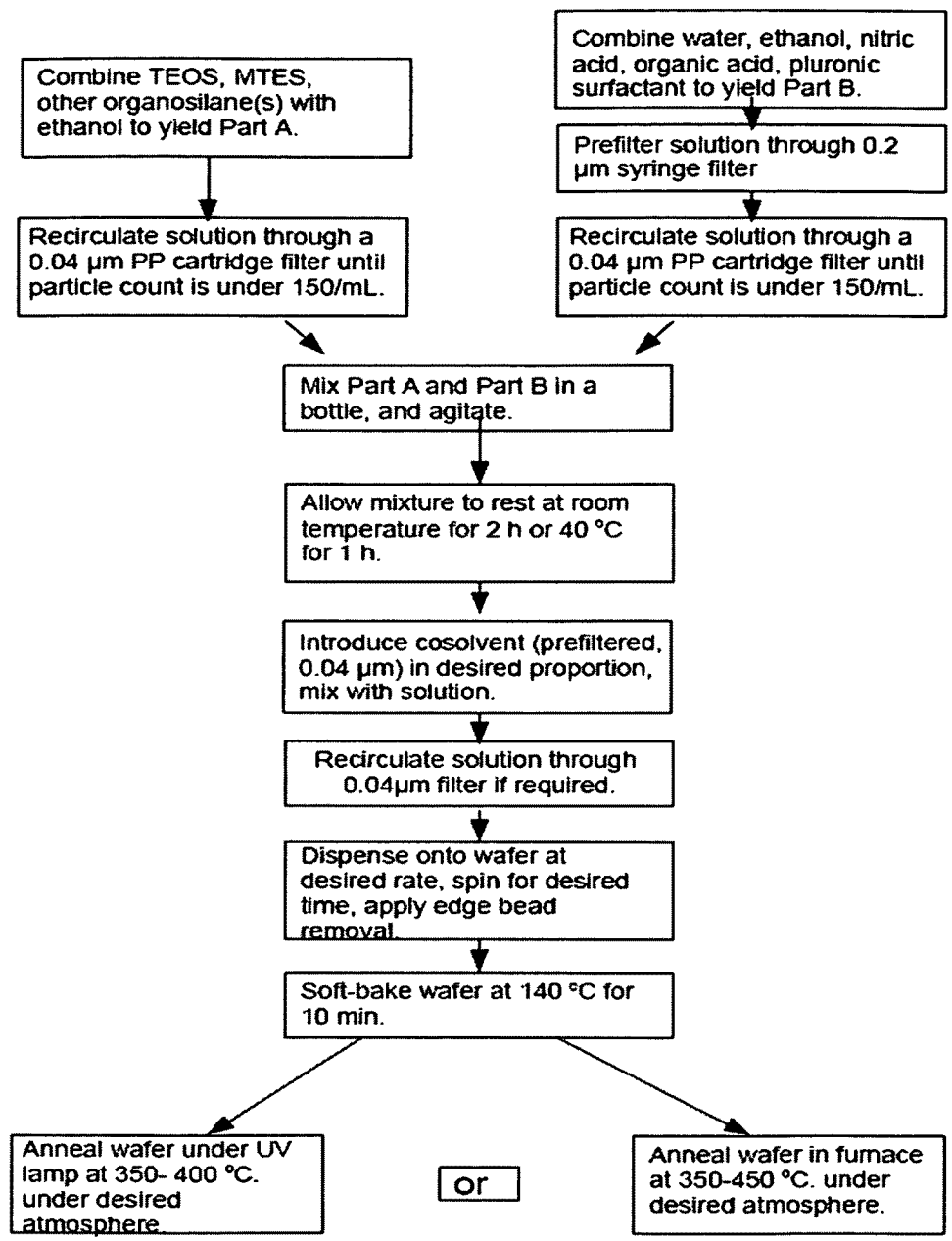
FIG. 2a is a flow diagram illustrating the preparation of a two-component sol and its deposition as a film on a wafer.
Figure 2B:
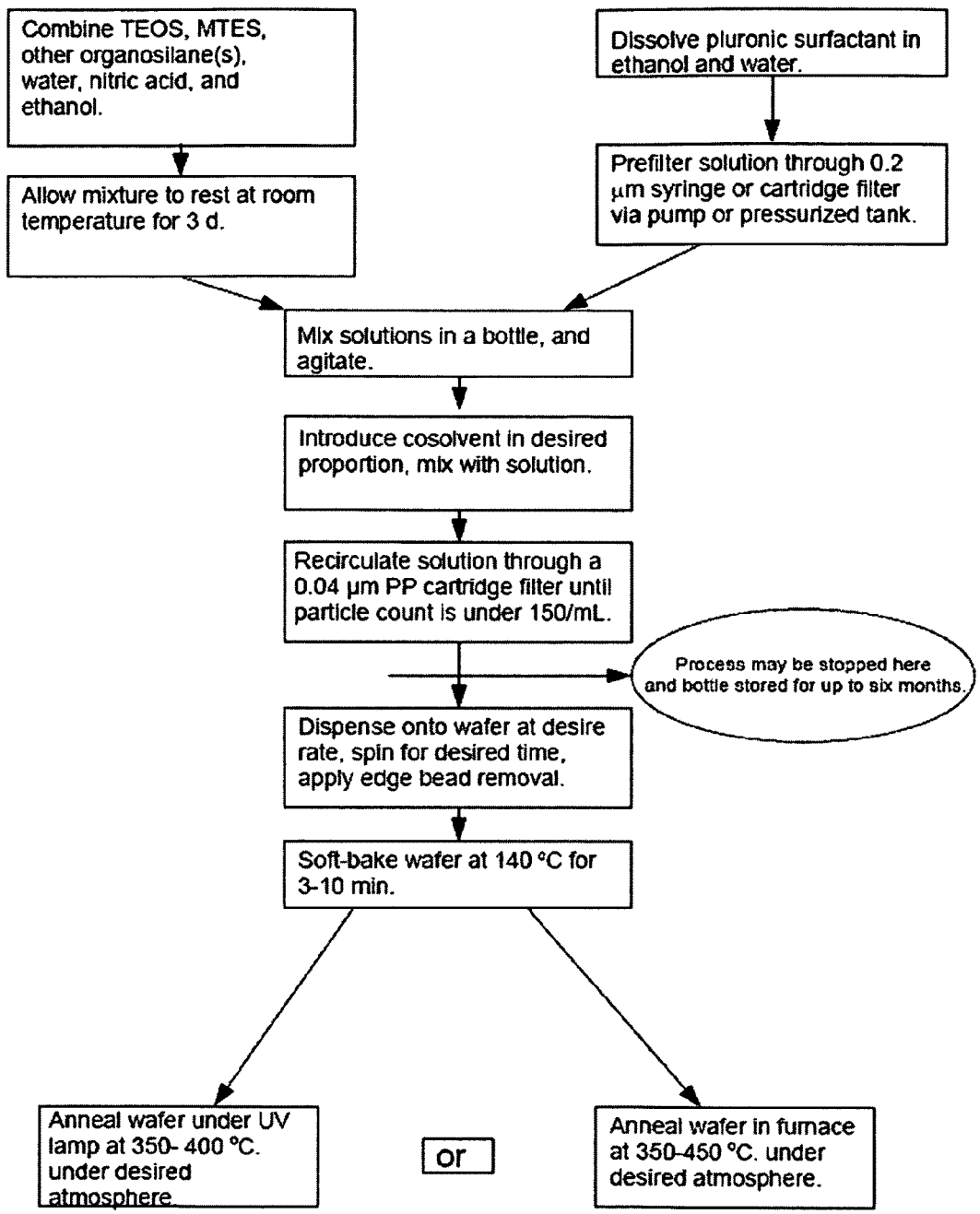
FIG. 2b is a flow diagram illustrating the preparation of a single component sol and its deposition as a film on a wafer.
Figure 3A:
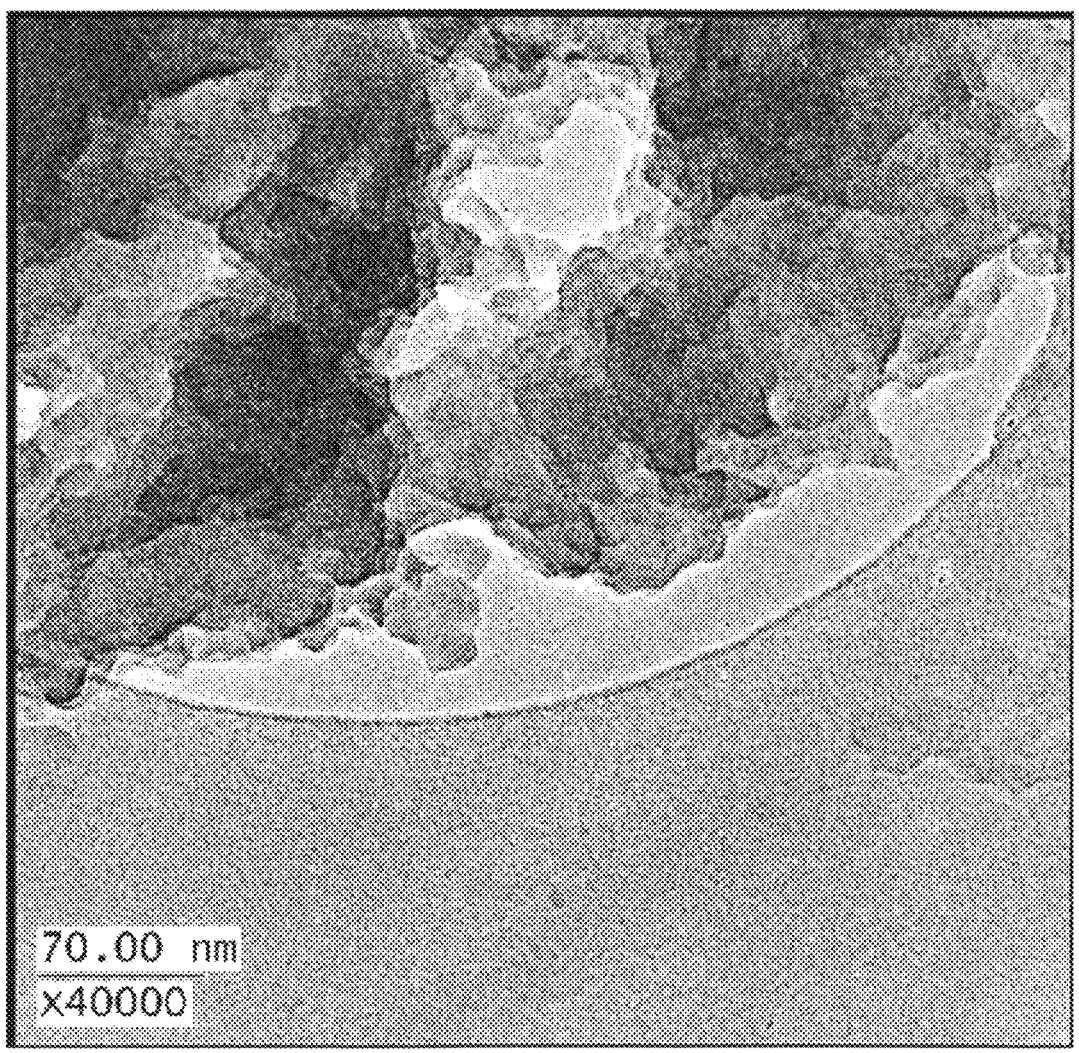
FIG. 3a is a TEM image of an uncured film.
Figure 3B:
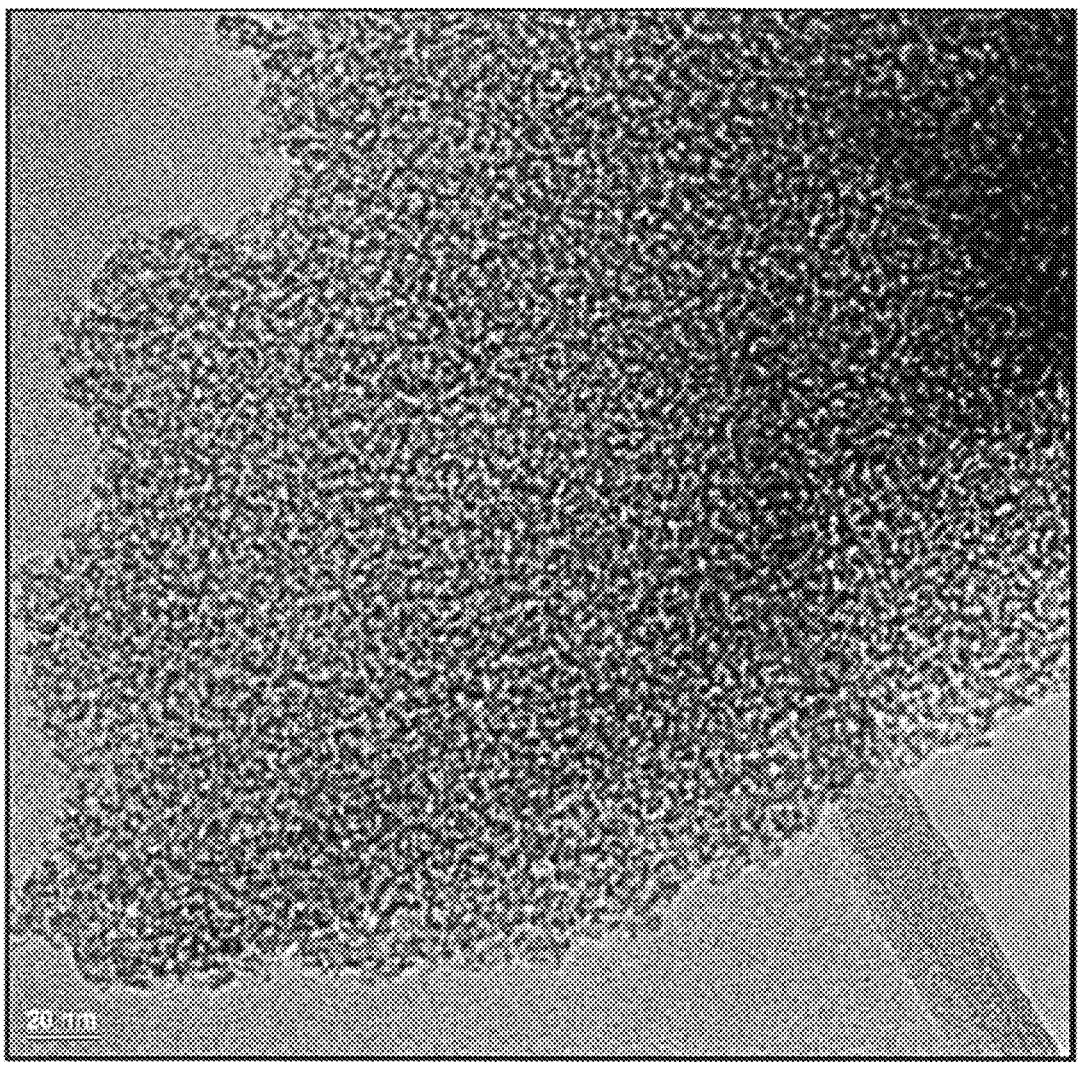
FIG. 3b is a TEM image of a film following furnace cure at 400° C.

The invention provides a novel spin-on dielectric composition formed from a sol having components to produce a lyotropic liquid crystal solution as the sol dries. This lyotropic solution may or may not impart order to the sol as it dries, but has the effect of producing a uniform pore size distribution upon removal of the surfactant template. The sol contains several components that affect the ability of the material to be uniformly coated onto a substrate, or influence the film dielectric constant after template is removed. These components are: (1) a source of silica; (2) a polar solvent, (3) water, (4) an acid catalyst, and (5) an amphiphilic block copolymer surfactant Optionally, one can add a co-solvent, an organic acid, and/or a reactive solvent. The acid catalyst is preferably a strong acid catalyst and can be inorganic or organic.

(1) Source of Silica

The source of silica is more particularly a mixture of silicate esters. Preferably this includes tetraethoxysilane, more commonly referred to as tetraethyl orthosilicate and abbreviated TEOS, in combination with alkylated silicate esters such as methyltriethoxysilane (MTES), ethyltriethoxysilane (ETES) or vinyltriethoxysilane (VTES). Under certain circumstances it may be advantageous to use esters of silicic acid or alkyl-silicic acid other than ethyl, such as methyl, propyl or butyl. It may also be advantageous to include silicones such as ethoxy-terminated poly(dimethylsiloxane). Other combinations can include: Phenylated silicate esters, alkylated or phenylated silicate esters wherein the alkene, alkane, or phenyl substituent contains a thiol, amino, halide, or hydroxyl group, or other desired moiety. Additionally, Methoxy-terminated esters such as methyltrimethoxysilane, tetramethoxysilane and methoxy-terminated poly(dimethylsiloxane). In particular, it may be useful to combine TEOS and MTES with another mono- or di-alkyl substituted silicate ester, such as ethyl triethoxysilane (ETES) or dimethyl dimethoxysilane (DMDS).

The ratio of TEOS to other components affects several qualities in the final film, including dielectric constant (k), elastic modulus and hardness, and water contact angle. In particular, for the case of mixtures of TEOS with MTES, sols with TEOS/MTES molar ratios ranging from 0.83 to 2 yield films with low k values and acceptable Young's moduli.

(2) Polar Solvent

The polar solvent affects the drying rate and thus film thickness at a particular spin speed. It also affects k and modulus, possibly by altering the structure of the solution as it dries. In particular, it is observed that using aprotic solvents reduces the amount of thickness reduction or shrinkage upon anneal. Such films have lower k but lower modulus than films prepared with protic solvents such as light alcohols. Additionally, small quantities of reactive solvents such as propylene oxide reduce shrinkage, k, and modulus as well. Reducing shrinkage offers the secondary benefit of reducing film stress.

Ethanol yields high quality films with acceptable k and modulus values. Acetonitrile lowers k but also decreases modulus. Propylene oxide may be partially substituted for ethanol to further lower k. Other solvents that can be used include: n-propanol, isopropanol, ethylacetoacetate, other short chain alcohols such as methanol, isobutanol and esters such as ethyl acetate or propyl acetate, and mono- and di-substituted glycol ethers such as 2-ethoxyethanol and glyme. Additionally acetone and THF may be used.

(3) Water

Water is essential to producing a solid film, and acts by hydrolyzing the silicate esters to yield a silica-surfactant nanocomposite. $H_2O$/Si ratio affects film modulus and sol pot life. We find that $H_2O$/Si mole ratios between 3 and 8, in particular 6, to be effective.

(4) Acid Catalyst

An acid catalyst is required for the water to hydrolyze the silicate esters. This is preferably a strong acid that leaves no metallic or halide residue upon calcination or anneal, and is present at a concentration between 0.01 mol/L $H_2O$ and 1.0 mol/L, particularly at 0.1 mol/L $H_2O$. Examples of acid catalysts that are effective include nitric acid ($HNO_3$), oxalic acid ($H_2C_2O_4$), and squaric acid ($H_2C_4O_4$). The latter increases both k and modulus of the final film. Weaker acids may be employed (viz. acetic, glycolic, citric acid) but without a strong acid present the films typically have lower Young's moduli.

(5) Organic Acid

An organic acid that has a lower ionization constant than the strong acid used as a catalyst can be included in the sol. This acid has the effect of increasing hardness and modulus in the final film if the film is initially "soft baked" at a moderate temperature (120-150° C., particularly 130° C.). This will also increase dielectric constant. Most of the acid decomposes and vaporizes during anneal, though it may be desirable for the acid to leave behind some carbon-containing residue. Examples of acids that are effective include citric acid, and glycolic acid, benzoic acid, ascorbic acid, salicylic acid, and any short-chain carboxylic acid or aryl-substituted acid, which may additionally have hydroxyl groups such as lactic acid, or a hydroxyl-substituted benzene such as pyrogallol.

(6) Amphiphilic Block Copolymer Surfactant

An amphiphilic copolymer surfactant is added to produce a lyotropic solution that forms an oxide-polymer nanocomposite while drying. It is desirable that this surfactant be electrically neutral and decompose at a low temperature (300-500° C.). Examples these include the poly(ethylene oxide)-block-poly(propylene oxide)-block-poly(ethylene oxide) detergents exemplified by the Pluronic™ surfactants, Pluronic™ being a trade name of BASF. These are included at concentrations from 2-10% w/v, with typical concentrations varying from 4-9%. At a given concentration, lowering the molecular weight of the Pluronic™ increases k. Increasing Pluronic concentration lowers k as well as modulus. Other examples of amphiphilic copolymer surfactants are the amphiphilic copolymers described in Stucky et al. U.S. Pat. No. 7,176,245, entitled: "Block copolymer processing for mesostructured inorganic oxide materials", the specification of which is incorporated herein by reference.

We find that using the PEO-PPO-PEO triblock copolymer referred to by its trade name Pluronic P104 to have some advantages over other surfactants in terms of its ability to template films with a particular modulus, k value, and microtexture. This does not limit the use of other polymer surfactants in this invention, many of which exhibit quite satisfactory performance. Among the Pluronic family of surfactants, it appears that there is an optimum ratio of hydrophilic (EO) to hydrophobic (PO) chain lengths, and that this ratio depends on the molecular weight of the surfactant. For example, at 5.9 kilodaltons (approximate MW of P104) the highest moduli for a given k value are found at a EO/PO ratio of approx. 4. At 1.85 kilodaltons the optimum EO/PO decreases and Pluronic L43 is most effective. Conversely, at 12.6 kD the optimum EO/PO ratio increases and Pluronic F127 is most effective.

Other polymer surfactants such as reverse Pluronics (PO-EO-PO), PEO-PBO-PEO (PBO=polybutylene), Brij (particularly, but not exclusively Brij 56), and Tergitol have been tested and are effective.

Surface-modified dendrimers such as PAMAM can be effective at templating porous low-k films although the curing requirements may differ from PEO-PPO surfactants.

(7) Co-Solvent

A co-solvent can be added to the sol made from the above components in order to improve the quality of the spun film and to control thickness. Many solvents are effective. Most effective are ethyl lactate, propylene glycol methyl ether acetate, and mono- and di-glycol ethers and their esters, particularly diethylene glycol monoethyl ether (2,2-EEE) and diethylene glycol monoethyl ether acetate (2,2-EEE acetate)

Several factors are considered when choosing the cosolvent, particularly evaporation rate and toxicity. Certain combinations of spin coater configuration and target film thickness will favor one solvent over another. For films that are 300 nm or thinner, low evaporation rate solvents such as 2,2-EEE, 2,2-EEE acetate, and dipropylene glycol monomethyl ether are optimal.

One can determine which solvents will not be effective as cosolvents by the observation that the usual failure mode from an ineffective solvent is excessive striation and/or thickness nonuniformity (i.e., films are excessively convex or concave). A test for excessive striation from a given solvent choice can be performed by mixing the sol with the cosolvent to be tested and dispensing the sol onto a wafer, and spinning the wafer at a speed between 1000 and 3000 rpm for wafers of 8" diameter and greater. If the optical and thickness uniformity of the resulting dried film is deemed acceptable the cosolvent has passed the striation test. A test for thickness nonuniformity maybe performed using a spin coater that allows a user-programmable dispense rate. A wafer of at least 8" diameter, and preferably 12" diameter, is spun at the desired speed, typically 1000-2400 rpm. The sol is dispensed at various rates or combination of rates until a film of the desired thickness uniformity is produced. If no dispense recipe can be found that yields the desired uniformity, the cosolvent fails the test.

It is important that the cosolvent is tested under conditions approximating actual use. In particular, test wafer diameter and spin speed should be similar or identical to the wafer size and spin speed to be used for production. In addition, a cosolvent that passes the uniformity test on one model of coater will fail the test on another.

A partial list of solvents that have been found effective is:
2,2-EEE
2,2-EEE acetate
diglyme
glyme
tetrahydrofuran (THF)
ethyl acetate
ethyl lactate
propylene glycol methyl ether acetate (PGMEA)
PGME, other glycol ethers
acetonitrile
2-butanone (MEK)
2-ethoxyethanol
propyl acetate
ethylacetoacetate
trichloroethylene
dipropylene glycol monomethyl ether (Dowanol DPM™, trademark of Dow)
propylene glycol propyl ether
diethyl carbonate A partial list of solvents that have been found ineffective is:
N-methyl 2-pyrrolidinone (NMP)
ethylene glycol diacetate
N-methyl formamide
dimethyl formamide
diethyl malonate
2,4-pentanedione,
pentanol,
propylene carbonate,
ethylene carbonate
gamma-butyrolactone Formulation The invention also includes methods of formulating the sol. There are two principal methods. In the first method, the ingredients are combined, at once or in stages, to form a sol that can be used immediately or more than 6 months after formulation. This is referred to here as a single component or "1-c" sol. In the second, the ingredients are combined in a fashion that prevents the hydrolysis reaction from taking place until the time of use. This is done by combining the silica-containing ingredients into a solution, which may be termed "part A", and separately combining the water and acid catalyst with other ingredients into a separate solution, termed "part B". This system is termed a two-component or "A/B" sol.

In the first (1-c) case generally, the sol is formed by mixing the silicate esters with ethanol, then adding a solution containing ethanol, water, and strong acid catalyst. Another solution containing polymer surfactant, alone or in combination with water and/or ethanol, is added at that time or after several days have elapsed since the hydrolysis reaction. Ideally, the polymer surfactant solution will have been prefiltered with a 0.22 µm or smaller filter prior to mixing. In some applications, it may be necessary to perform ion exchange on the polymer solution to removed unwanted metal ions such as Na+. Cosolvent is then added in the desired concentration. Optionally, extra cosolvent may be added at the time of manufacture to later produce a film of a particular thickness when it is spun. As an alternative, cosolvent may be added during manufacture in a partial amount, and additional cosolvent may be added to "thin" the product at the point of use prior to spin. The cosolvent is ideally chosen such that it is not expected to significantly hydrolyze in the presence of water and acid catalyst within the rated shelf life of the product.

In the second (A/B) case generally, the sol is formed by combining the silicate esters with ethanol (or other solvent), and separately combining the water, strong acid catalyst, organic acid, and polymer surfactant with ethanol (or other solvent). These solutions, termed Part A and B respectively, are then mixed, either immediately or at a later date. It may be advantageous to heat the resulting sol to 40-60° C. to promote hydrolysis of the silicate esters. The hydrolyzed sol is then mixed with the cosolvent in the desired ratio. This ratio will depend on the intended film thickness, wafer diameter, and the evaporation rate of the cosolvent among other factors, but is typically between 3 parts sol: 1 part cosolvent and 1 part sol: 1 part cosolvent by volume. The diluted sol is filtered prior to dispense through a 0.10-0.22 micrometer filter. One or both of the original solutions may be filtered prior to mixing, which improves the speed and quality of the final filtration (after sol is diluted with cosolvent).

The shelf life of 1-c sol is known to exceed 6 months. The shelf life of parts A and B in the A/B system is known to be at least 6 months. Both A/B and 1-c sols may be stored at ambient temperature. The pot life of the mixed sol is defined by the change in dielectric constant of a film spun from the sol as the sol ages. Typically the dielectric constant of the spun film changes little in the first 8 hrs after the sol is mixed. Sols that have aged longer than 16 hrs typically yield films with higher dielectric constants.

More particularly, to prepare an example of 1-c sol, 500 g tetraethoxysilane, 500 g methyltriethoxysilane, 450.6 g water, 1000 g ethanol, and 5.62 g 1.0 N nitric acid are mixed and allowed to sit at room temperature for three days. A second solution is prepared, containing 105.4 g water, 440 g ethanol, and 207.6 grams of BASF Pluronic P104 block copolymer surfactant. The second solution is ion exchanged using acid-exchanged Dowex™ Monosphere 650C UPW or Dowex HCR W2 ion exchange resin or $NH_4$-exchanged Zeolite LTA, then filtered through a 0.22 µm syringe filter via a pressure tank. The second solution is added to the first after the three day period, and the completed mixture was diluted with 1200 g 2-(2-ethoxyethoxy)ethanol.

Alternately, the second solution may be purified by dialysis rather than ion exchange.

To prepare an example of A/B sol,
Part A:
3315.1 g ethanol, 2638.5 g methyltriethoxysilane, 2638.5 g tetraethoxysilane are placed in a 10 L media bottle, mixed, filtered through a 0.04 µm capsule filter and stored.

Part B:
1655.5 g of BASF P104 Pluronic surfactant or equivalent are dissolved in a solution of 2676.5 g water, 4293.6 g ethanol, 297.5 g 1.0 N nitric acid, and 263.3 g citric acid. Mixture is filtered through a 0.04 µm capsule filter and stored.

To use, equal volume portions of "A" and "B" are mixed and allowed to age for 2 h at room temperature or 1 hr at 40 C before use.

More particularly, 6.25 g each of tetraethoxysilane (TEOS) and methyltriethoxysilane (MTES) are mixed with 9.0 g ethanol to make part A. Separately, 3.87 g Pluronic P104, 0.62 g citric acid, and 7.02 g 0.1 N HNO3, are dissolved in 9.0 g ethanol to make part B. These solutions are mixed, sealed and placed in a water bath heated to 40 C for 1 hr. to form the sol. The sol is then mixed with diethylene glycol ethyl ether (2,2-EEE) in the desired ratio. For example, if the desired ratio is 3:1, 30 mL of the sol is mixed with 10 mL 2,2-EEE. The diluted sol is then filtered through a 0.22 µm syringe filter and dispensed onto a silicon wafer. The diluted sol is preferably used within 8 hr after mixing.

It is possible to make the sol without heating it on a water bath. However, this will increase the reaction time and will delay the solution from reaching its final state of hydrolysis until about 2-3 hrs after mixing. In turn this would delay the start of a wafer production run.

It is also possible to make a "stripped sol" with a significantly longer pot life. A stripped sol is made by combining the components of Parts A and B (with or without citric acid [or other organic acids] and Pluronic; generally without) and heating and stirring until hydrolysis is complete. It may be beneficial to add only a portion of the final amount of water, typically about ⅓ of the total, before the sol is heated. The heating is done at any temperature at or below the boiling point of the solvent, though 60° C. is often employed. Heating and stirring are continued until hydrolysis is complete; 16 hr will generally suffice. After hydrolysis the original solvent is partially distilled off until ⅓-½ of the original volume remains, after which the lost solvent volume is replaced with a solvent from which the silica sol is less susceptible to attack from re-esterification. Such a solvent may be aprotic, such as acetone or acetonitrile, or may be hindered, such as 2,2-EEE. Esters such as ethyl acetoacetate or 2,2-EEE acetate may be employed although the solvent should not be excessively acid labile.

Following solvent addition the sol is redistilled until ⅓-½ the original volume remains and the desired solvent is added. This is repeated a third time, with the final solvent addition making up the original sol volume. Block copolymer surfactant is added, citric or other organic acid is added if desired, a cosolvent is added if desired, and the sol is filtered prior to dispense.

More particularly, an acetonitrile-based sol may be prepared by combining 6.25 g each of tetraethoxysilane (TEOS) and methyltriethoxysilane (MTES) with 18 g acetonitrile and 2.34 g 0.3 N $HNO_3$. This is heated at 60° C. with stirring for 16 hr. The acetonitrile and residual ethanol (from ester hydrolysis) and water are distilled off in a vacuum distillation apparatus such as a Büchi Rotavapor™ or equivalent until the sol volume is ca. 0.3-0.5 mL of its original volume, then replaced with fresh acetonitrile. This process is repeated as necessary until no more ethanol distills off (usually about 3 times). Such a sol will have substantially reduced k and modulus vs. an alcohol-based sol but may have a much longer pot life. Alternately, an ethanol-based sol may be subjected to the above treatment and yield the same result, though the solvent removal/replacement process may be lengthier.

The wafer may be coated using a manual or automated spin coater, and the sol may be dispensed statically (i.e., with the wafer not rotating) but is preferably dispensed dynamically, i.e., with the wafer rotating. A typical rotation speed for dispense would be 400-500 rpm. The rotation speed for the spin cycle depends on the desired film thickness and thickness uniformity, wafer diameter, type of wafer chuck, and exhaust condition of the spin bowl. The films may be effectively spun at speeds between 500 and 4000 rpm, though it is generally advantageous to use a dilution that will yield the desired film thickness at a spin speed between 1000 and 2000 rpm.

Nature of the Film and Methods of Treatment

In general, the spun films are subjected to a low temperature "soft bake" at a temperature between 130° C. and 150° C. for between 5 min. and 16 hr. with shorter times more desirable for increasing wafer throughput and longer times for increasing the modulus of the final product. If desired, the spun films are dried for 5-20 minutes at 90-110° C. prior to soft bake; this is done if the wafers must be stored or handled between the spinning and soft bake steps. Following soft bake the coated wafers may be annealed immediately, though wafers may be stored indefinitely following soft bake.

Films are annealed at temperatures between 200 and 500° C., more particularly between 350 and 425° C. While films may be annealed in air, this is generally incompatible with copper damascene processing since the copper will be oxidized. Films may be annealed in vacuum, nitrogen or argon, or forming gas (hydrogen diluted with $N_2$ or Ar to approx. 5% or less by volume). Films may be annealed in several atmospheres, including but not limited to, vacuum, $N_2$, Ar, He, mixtures of inert gases, water vapor entrained in an inert carrier gas such as $N_2$, $CO_2$, $H_2$, and forming gas ($H_2$ entrained in inert gas). Gas mixtures containing oxygen at a partial pressure exceeding 0.2 bar are generally avoided due to excessive oxidation of the film, though excess $O_2$ may become advantageous at lower curing temperatures (375° C. and below) if Cu is not present.

Films may be annealed in the absence of an illumination source. Optionally, they may be annealed in the presence of ultraviolet (UV) illumination at a wavelength or wavelengths between 170 and 365 nm. This can have the effect of reducing k and increasing Young's modulus. Films must still be heated at 250-450° C. during illumination. Anneal atmosphere must be consistent with the wavelengths chosen; shorter wavelengths (in particular less than 190 nm) will require vacuum or He or mixtures of He and $H_2$.

Films cured at lower temperatures (ca. 250° C.) can have dielectric constants and Young's moduli equivalent to films cured at higher temperatures. The use of forming gas, longer cure times, and in-situ UV illumination may help achieve this.

Figure 4:
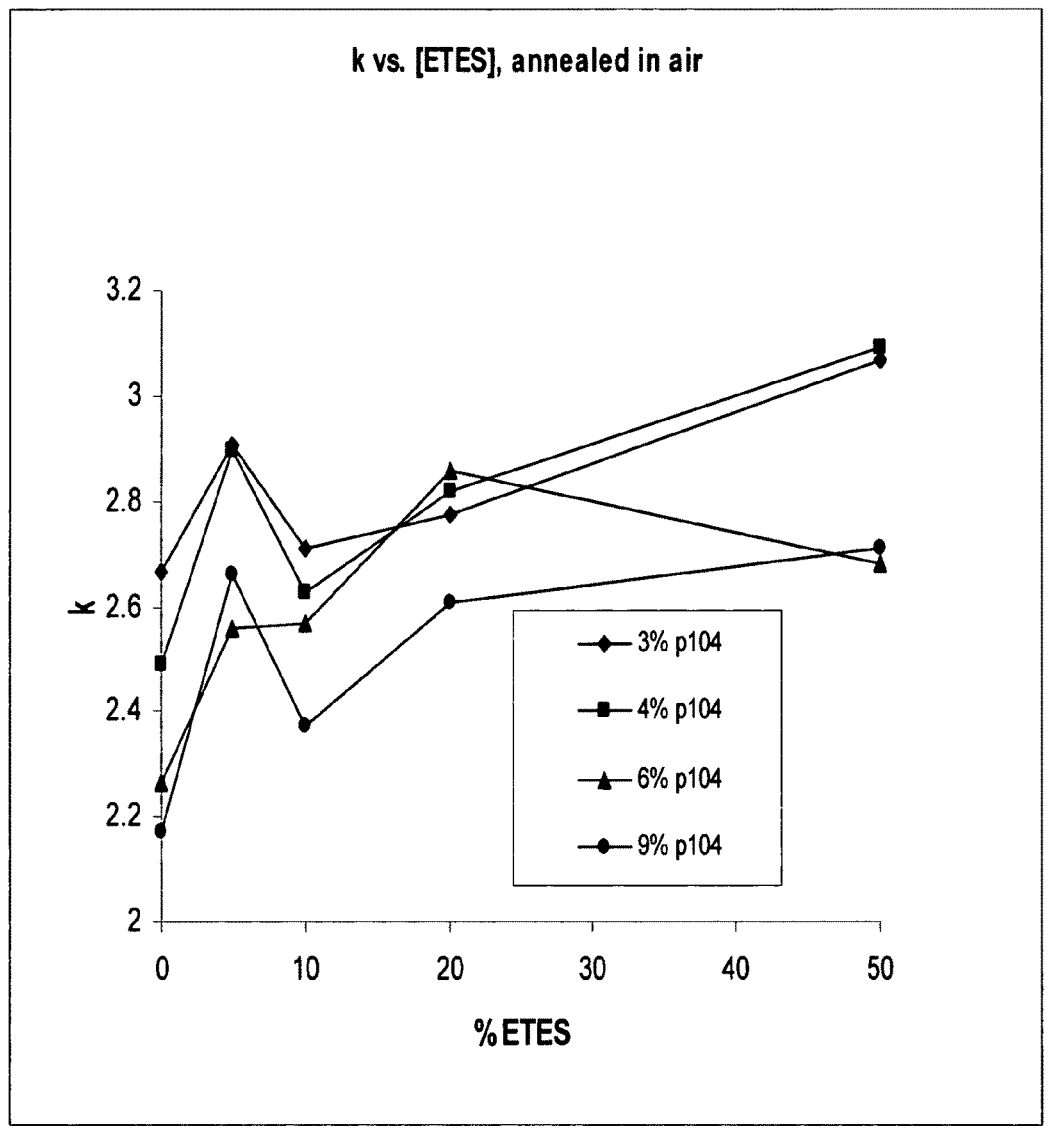
FIG. 4 shows a graph illustrating the relationship between K and ETES concentration within the film compositions annealed in air.
Figure 5:
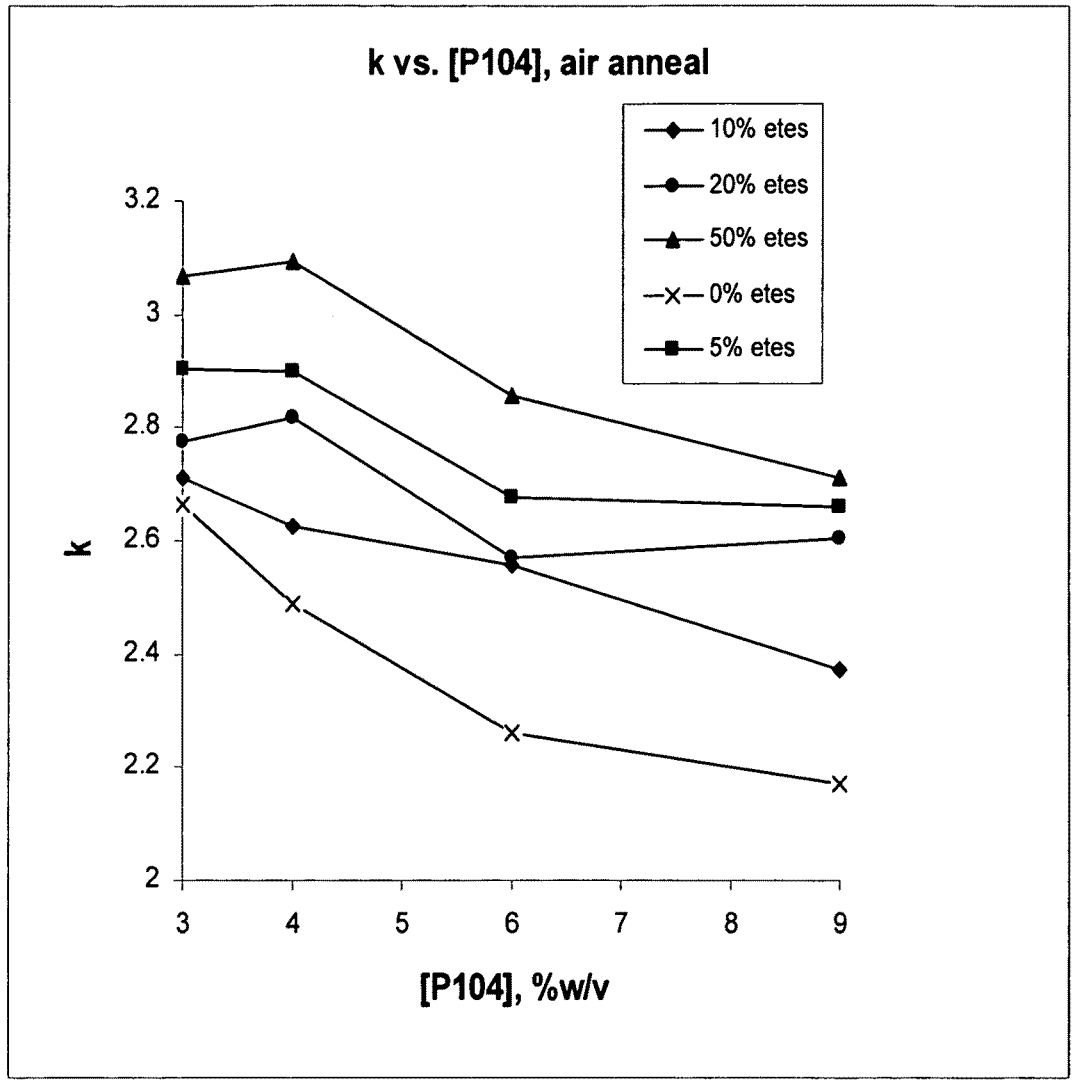
FIG. 5 shows a graph illustrating the relationship between K and P104 concentration within the film compositions annealed in air.
Figure 6:
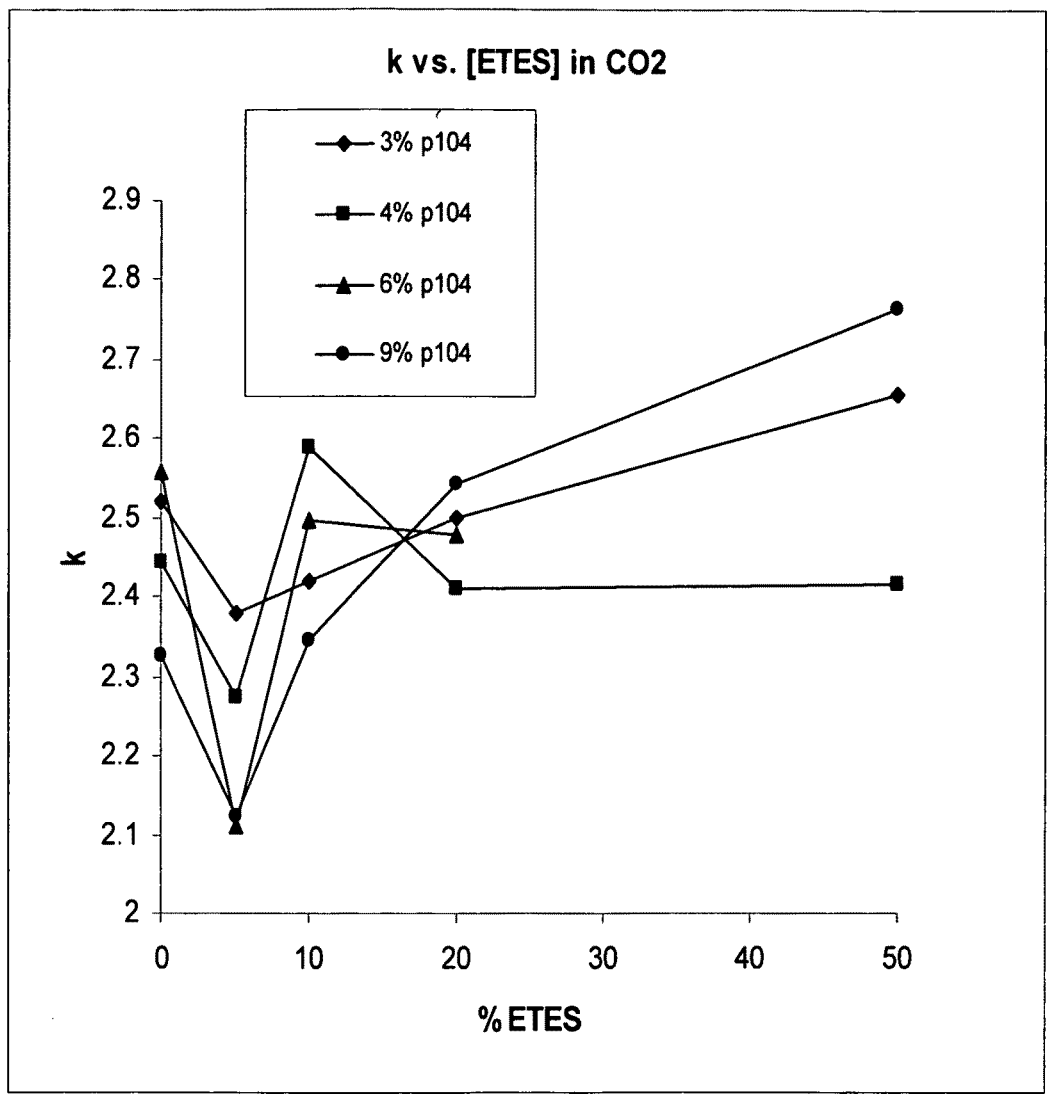
FIG. 6 shows a graph illustrating the relationship between K and ETES concentration within the film compositions annealed in $CO_2$.
Figure 7:
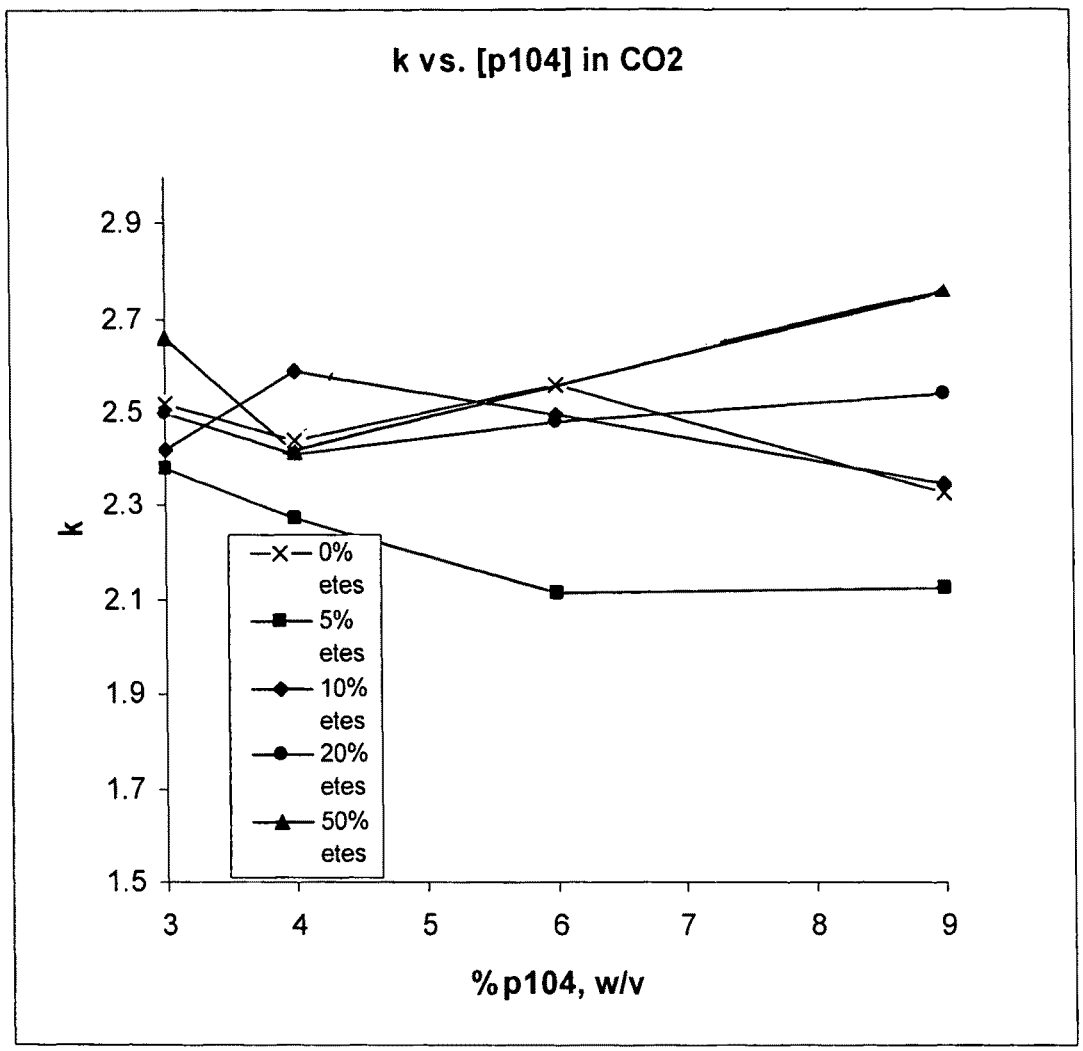
FIG. 7 shows a graph illustrating the relationship between K and P104 concentration within the film compositions annealed in $CO_2$.
Figure 8:
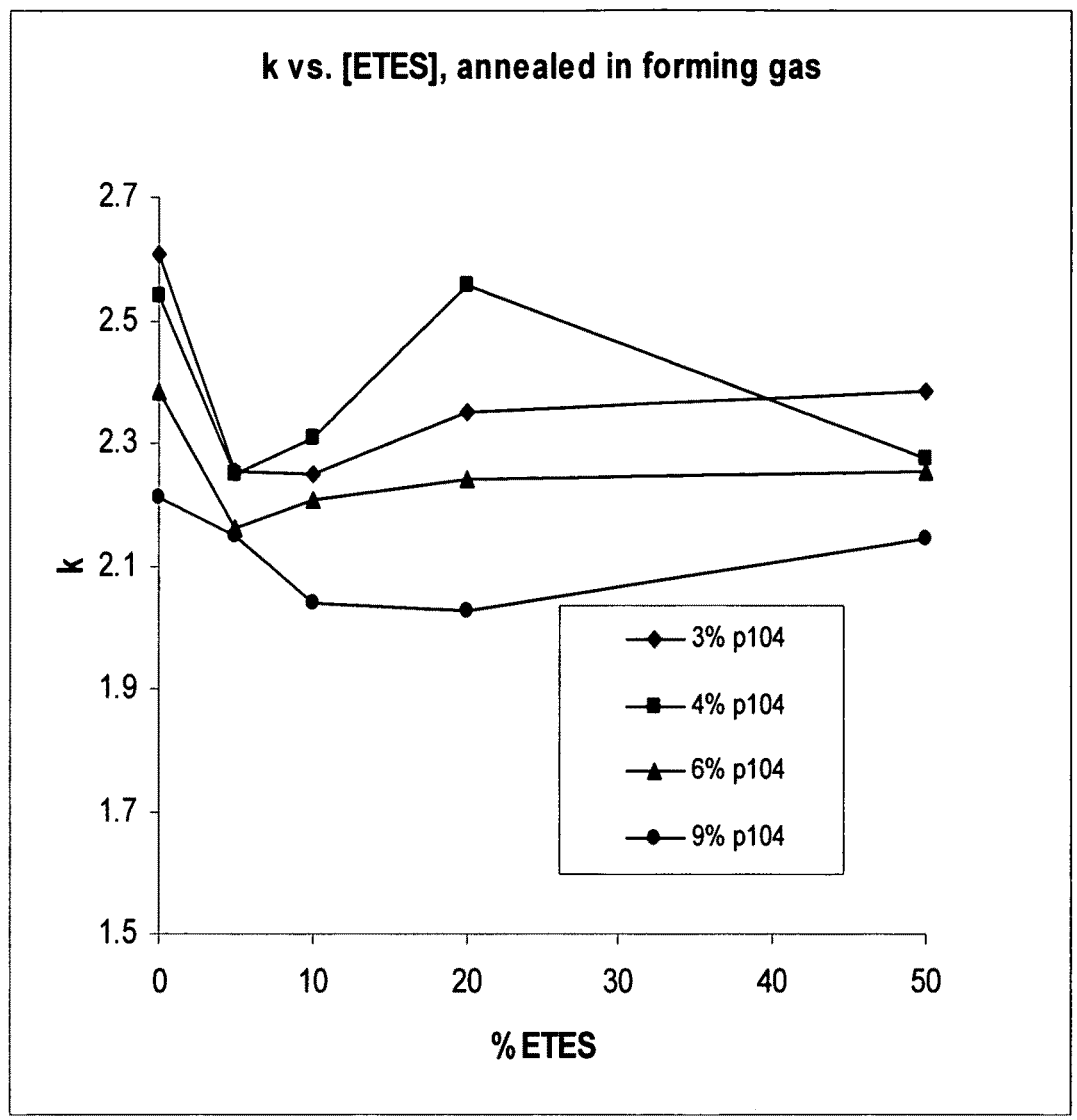
FIG. 8 shows a graph illustrating the relationship between K and ETES concentration within the film compositions annealed in forming gas.
Figure 9:
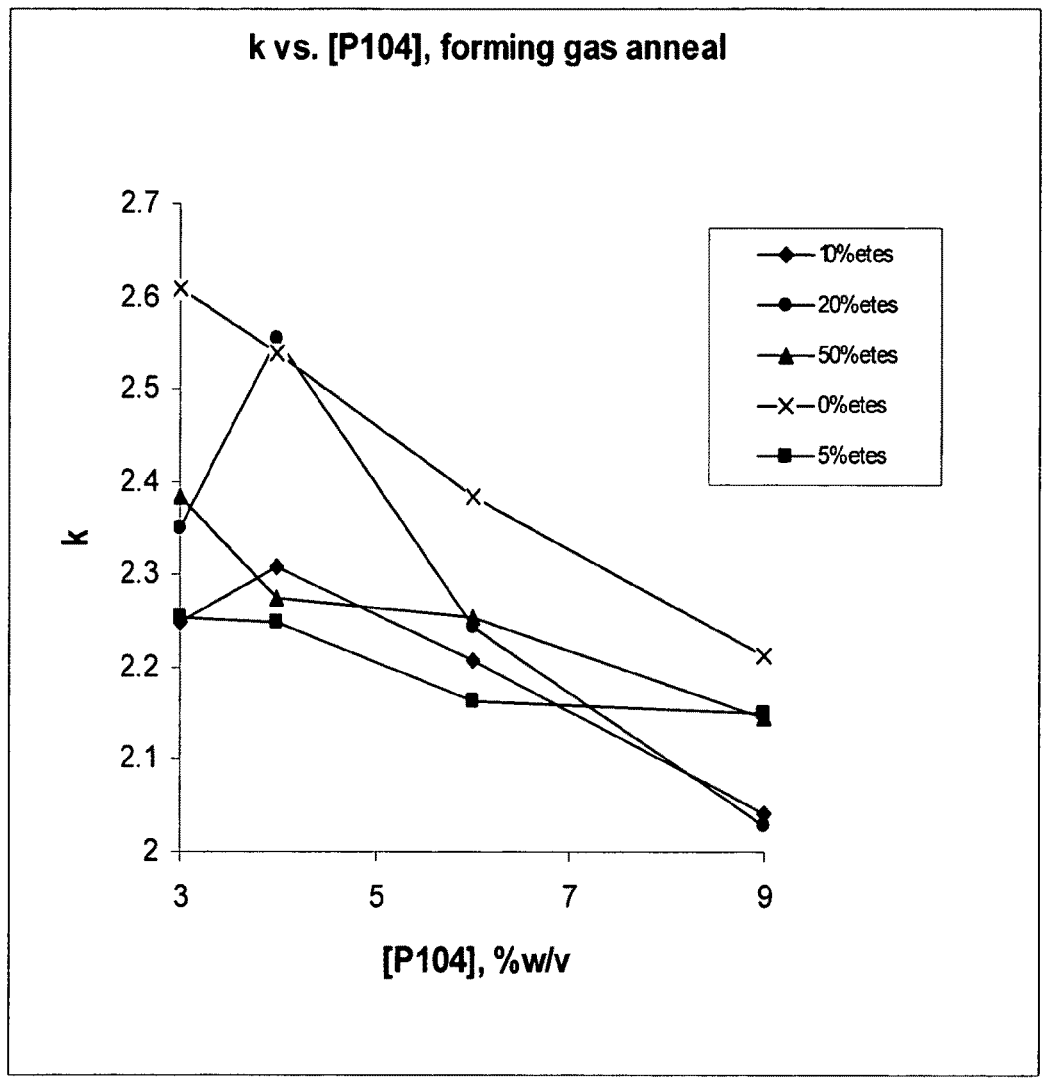
FIG. 9 shows a graph illustrating the relationship between K and P104 concentration within the film compositions annealed in forming gas.
Figure 10:
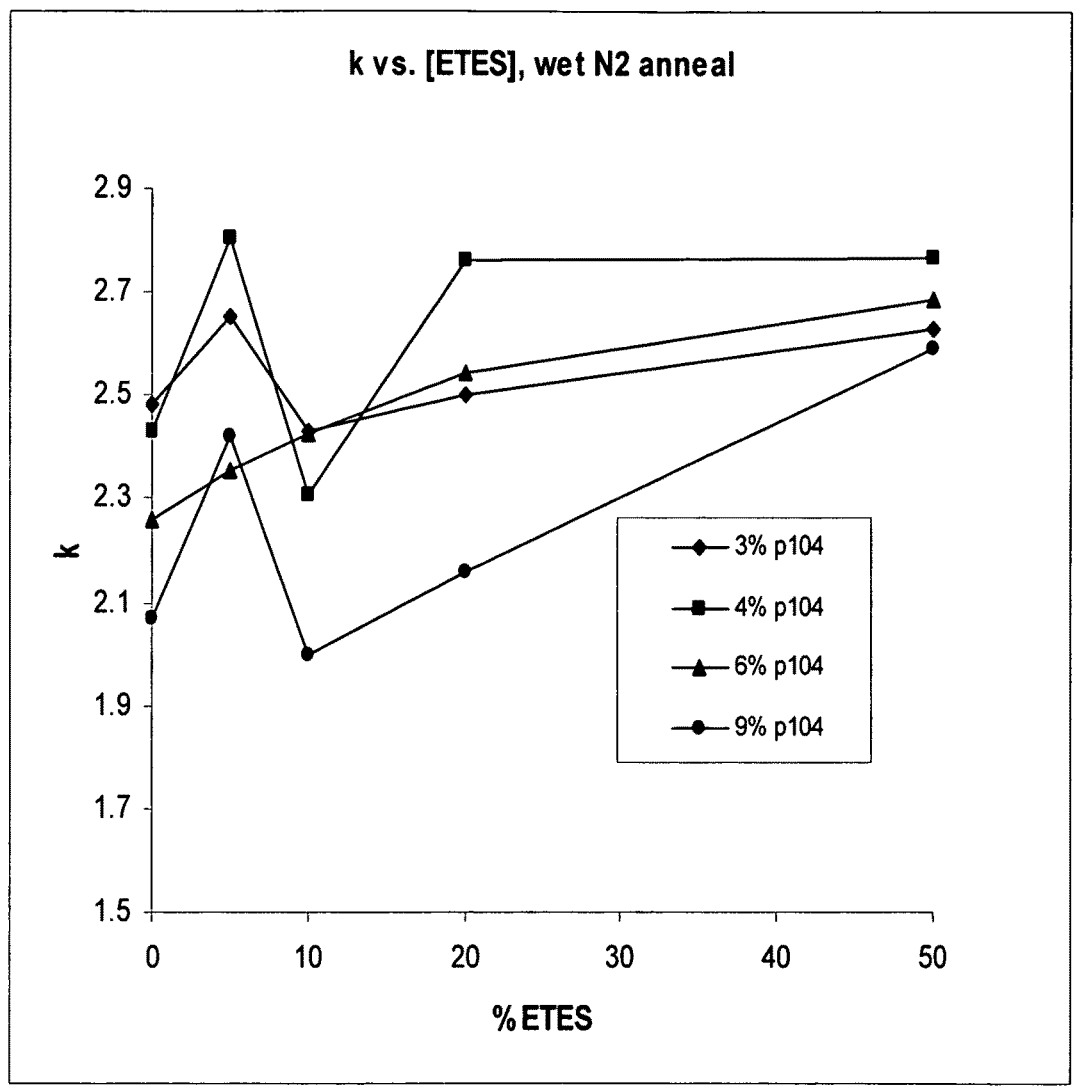
FIG. 10 shows a graph illustrating the relationship between K and ETES concentration within the film compositions annealed in wet $N_2$.
Figure 11:
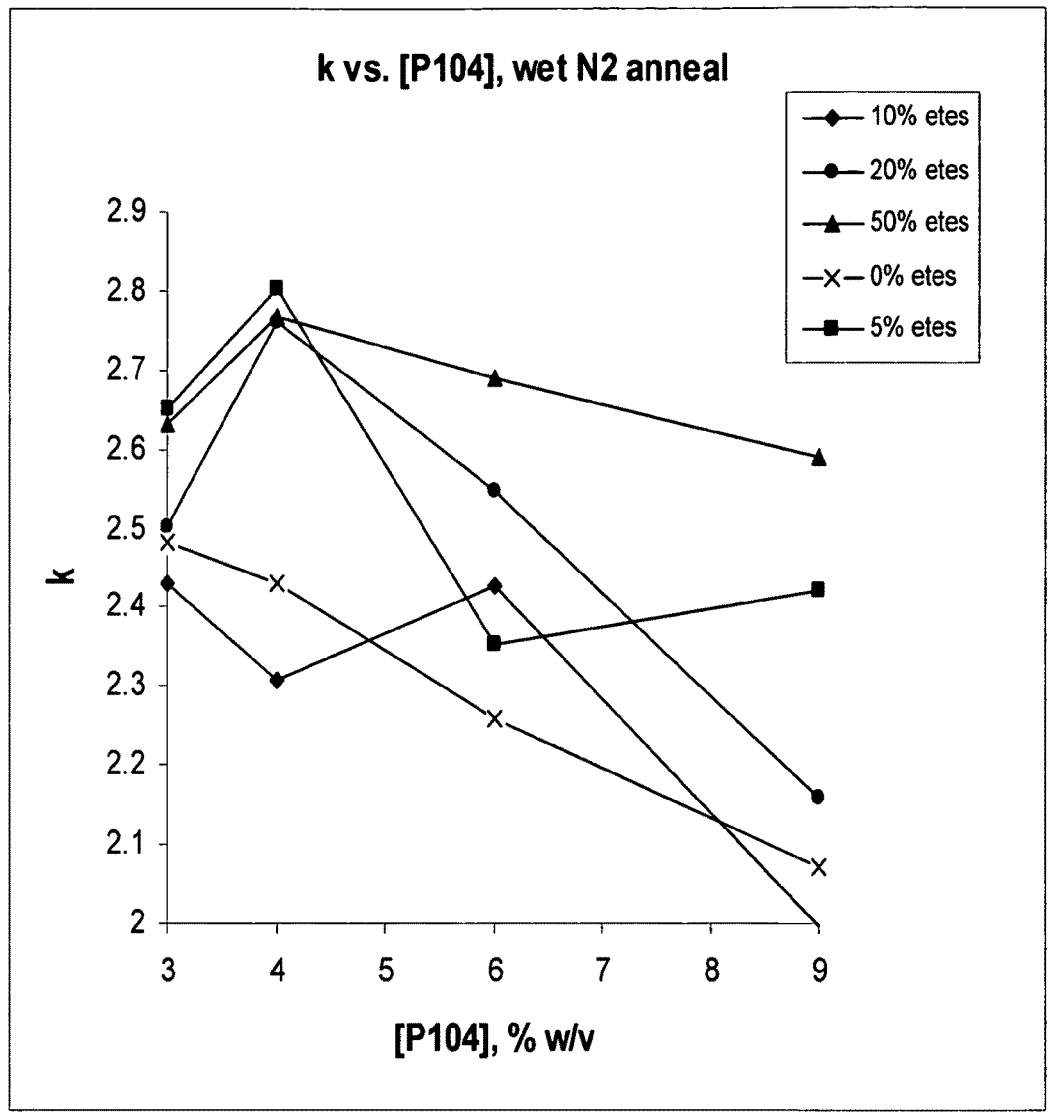
FIG. 11 shows a graph illustrating the relationship between K and P104 concentration within the film compositions annealed in wet $N_2$.
Figure 12:
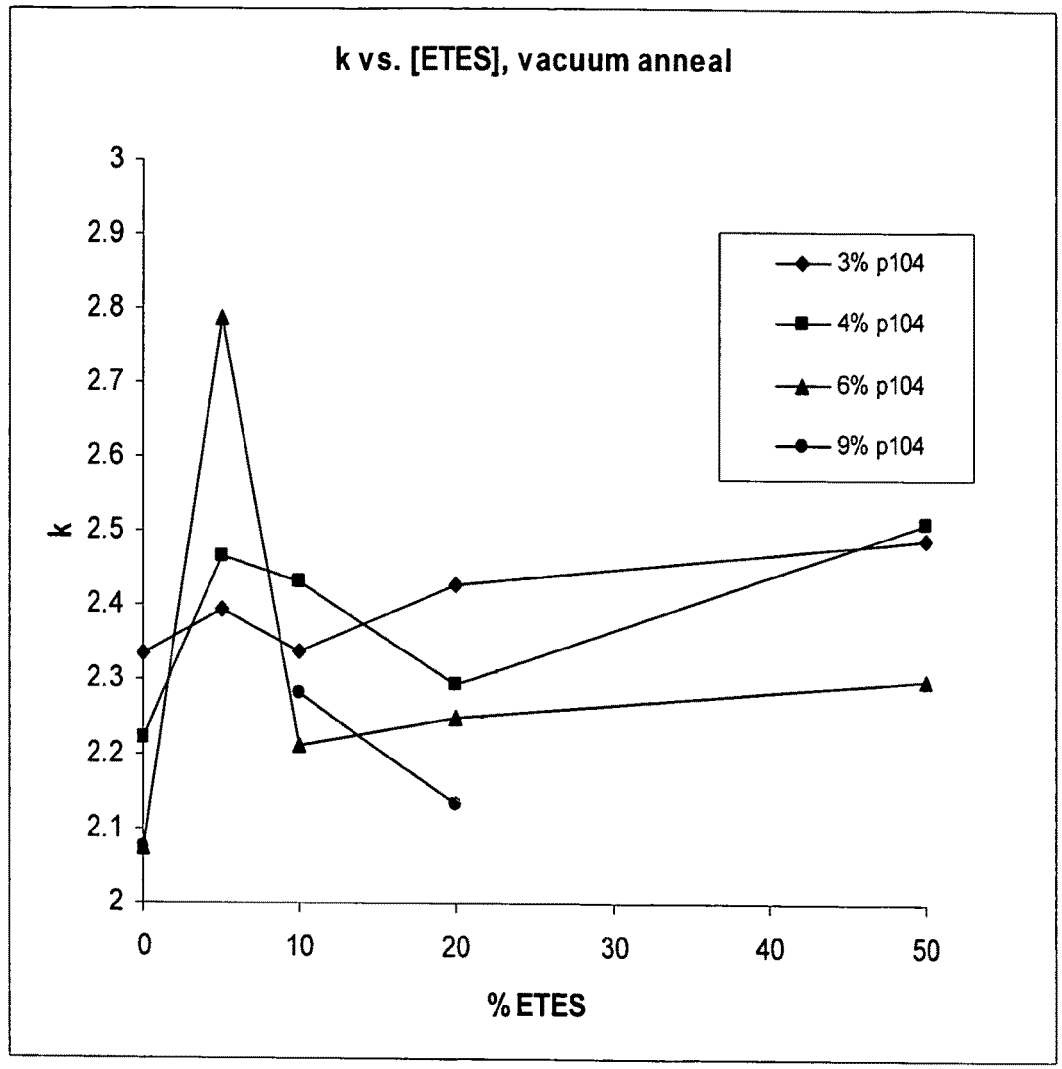
FIG. 12 shows a graph illustrating the relationship between K and ETES concentration within the film compositions vacuum annealed.
Figure 13:
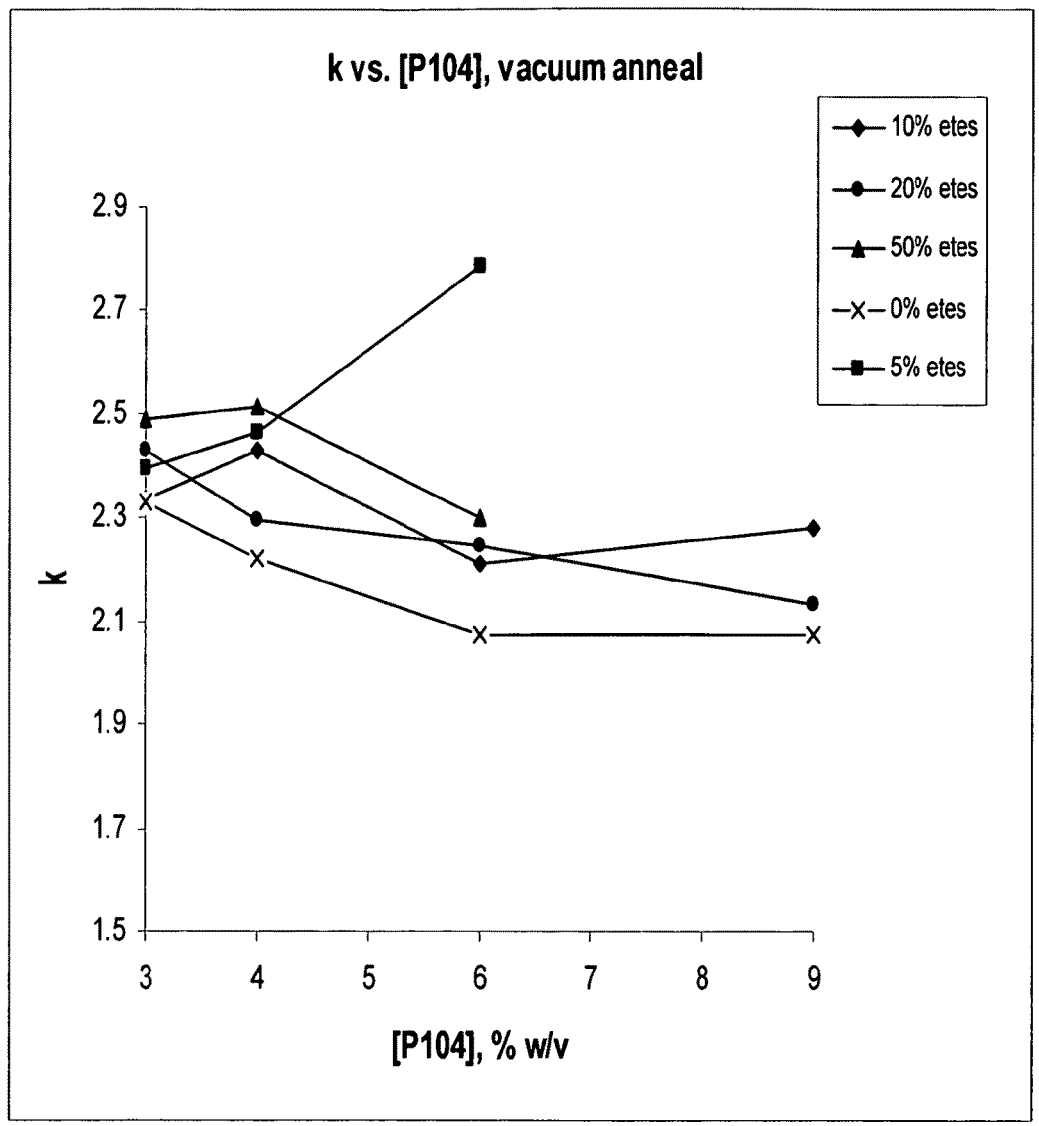
FIG. 13 shows a graph illustrating the relationship between K and P104 concentration within the film compositions vacuumed annealed.
Figure 14:
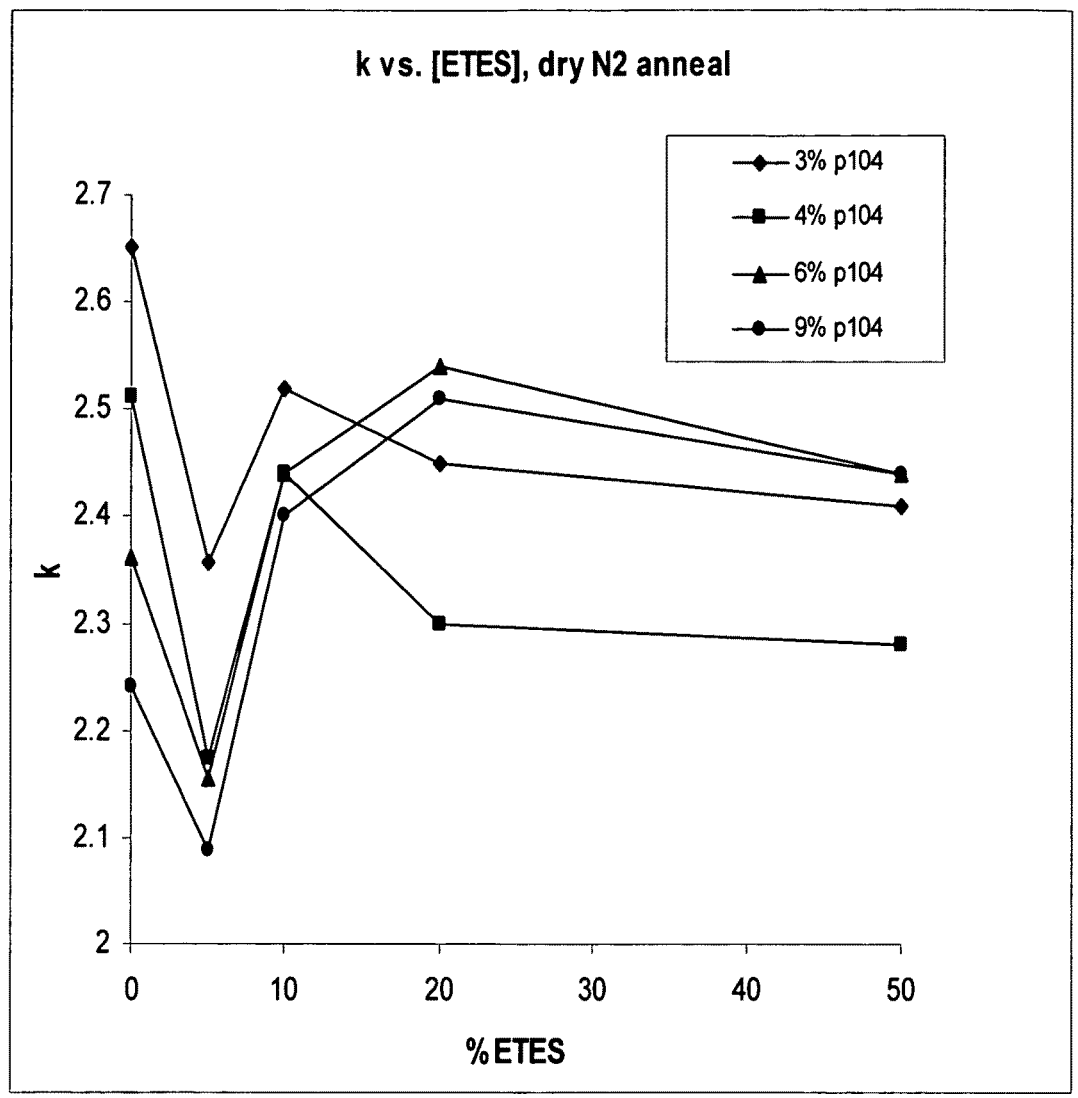
FIG. 14 shows a graph illustrating the relationship between K and ETES concentration within the film compositions annealed in dry $N_2$.
Figure 15:
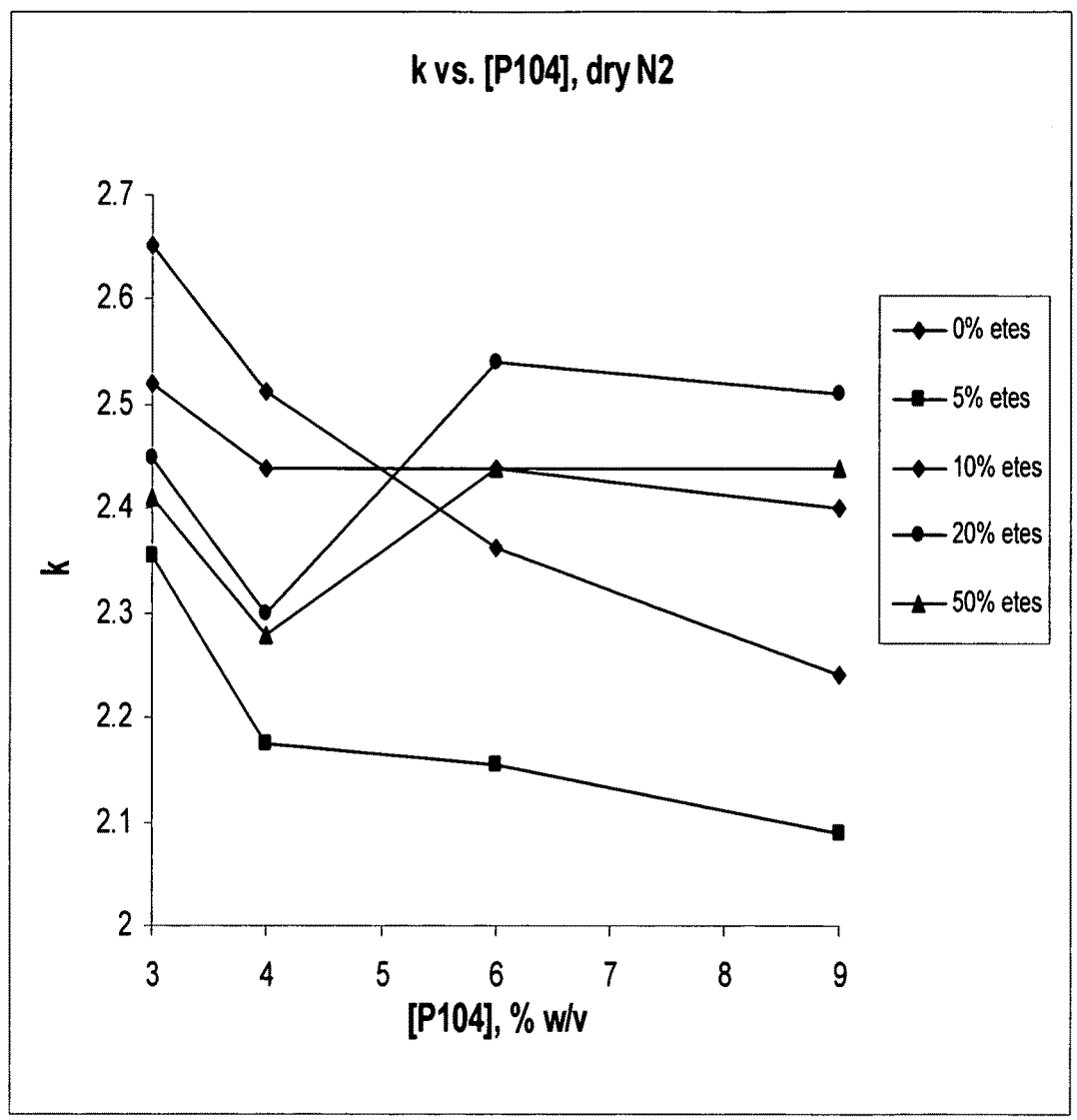
FIG. 15 shows a graph illustrating the relationship between K and P104 concentration within the film compositions annealed in dry $N_2$.

A partial list of the effects of various curing atmospheres may be seen in FIGS. 4-15.

More particularly, after spin coating the wafer is soft baked in an oven or on a hot plate for 10 minutes at 140° C. This can be done in air or inert atmosphere. It is then annealed in a furnace or on a hot plate or in a rapid thermal annealer at 425° C. for 10 min. in a $N_2$ atmosphere. Annealing in air slightly increases both k and E vs. annealing in $N_2$ or Ar. However, annealing in air is incompatible with copper damascene processes. Also, it is also sometimes advantageous to cure the films in more than one step, with a low temperature cure (250-350° C.) occurring before a higher temperature cure step (350-500° C.).

The films produced are resistant to atmospheric moisture and damage caused by ashing, and are also resistant to atmospheric moisture attack after they have been ashed.

As previously mentioned, it is a goal of this invention to produce dielectric films with an expanded E-k envelope. One can reduce the dielectric constant by altering the above recipe in several ways, though each will reduce the modulus. Conversely, it is possible to increase modulus with the penalty of increasing k. By correctly applying two or more of these conflicting factors it is possible to reduce k substantially while maintaining an acceptable value of Young's modulus.

Factors that reduce k (and E) include: using an aprotic solvent such as acetonitrile in place of ethanol, introducing propylene oxide as a cosolvent, altering the TEOS/MTES ratio, partially replacing either TEOS or MTES with an alkyl trialkoxysilane where the alkyl group contains 2 or more carbon atoms, soft baking in a reactive atmosphere such as ammonia, steam, or methylamine, and annealing in an atmosphere other than air. Factors that increase E (and k) include the use of squaric acid (3,4-dihydroxy-3-cyclobutene-1,2-dione) as the strong acid catalyst or as the organic acid, using an organic acid such as citric acid in significant quantity (at least 0.01 mol acid/mol Si) and, under certain circumstances, UV illumination during cure. Longer soft bake times (up to 16 hr.) increase E without increasing k.

More particularly, an acetonitrile-based sol may be prepared by combining 6.25 g each of tetraethoxysilane (TEOS) and methyltriethoxysilane (MTES) with 9.0 g acetonitrile to make part A. Separately, 3.87 g Pluronic P104, 0.62 g citric acid, and 7.02 g 0.1 N $HNO_3$, are dissolved in 9.0 g acetonitrile to make part B. Parts A and B are then mixed prior to use. Alternately, parts A and B can be mixed immediately and heated at 40-60 C for 16 hr. The acetonitrile and residual ethanol (from ester hydrolysis) and water are distilled off in a vacuum distillation apparatus such as a Buchi Rotavapor or equivalent until the sol volume is ca. 0.3-0.5 of its original volume, then replaced with fresh acetonitrile. This process is repeated as necessary until no more ethanol distills off (usually about 3 times). Such a sol will have substantially reduced k and modulus vs. an alcohol-based sol but will have a much longer pot life (at least several months). Alternately, an ethanol-based sol may be subjected to the above treatment and yield the same result, though the solvent removal/replacement process may be lengthier.

Propylene oxide can partially replace ethanol, lowering k (and E) and potentially lengthening pot life. An example follows:

6.25 g each of tetraethoxysilane (TEOS) and methyltriethoxysilane (MTES) are mixed with 6.0 g ethanol and 3.0 g propylene oxide to make part A. Separately, 3.87 g Pluronic P104, 0.62 g citric acid, and 7.02 g 0.1 N $HNO_3$, are dissolved in 9.0 g ethanol to make part B. Parts A and B are mixed and used in a fashion similar to that employed in prior embodiments.

Partially replacing TEOS or MTES with ethyl triethoxysilane or dimethyl diethoxysilane can reduce k. An example follows:

6.25 g TEOS, 5.94 g MTES, and 0.31 g ETES (ethyl triethoxysilane) are combined with 18 g ethanol. Separately, 0.62 g citric acid is dissolved in 7.02 g 0.1 N aqueous $HNO_3$. The two solutions are mixed and used in a fashion similar to that employed in prior embodiments.

Soft baking in a reactive atmosphere reduces both k and E, but the reduction in k may be very substantial. This may be accomplished by placing the wet, freshly spun wafers in a tube furnace or other enclosed apparatus and passing ammonia vapor entrained in a carrier gas such as air or $N_2$ over the wafer. The wafer is then heated via a furnace or hot plate to 140° C. for up to 10 min. The ammonia vapor may be supplied by anhydrous $NH_3$, or it may be wet ammonia vapor made by bubbling the carrier gas through a solution of aqueous $NH_3$. Other volatile amines such as methylamine ($CH_3NH_2$) may be used with similar effect. Water vapor may also be used. This is accomplished by heating water to 40-100° C., preferably 80° C., sparging the water with a carrier gas, and exposing the wafer to water vapor. Care must be taken to make sure that the temperature of the wafer remains higher than the local dew point. Alternately, the wafer may be heated in a sealed system into which water has been introduced.

Wafers may be exposed to UV light during soft bake or cure. The effect of UV on k and modulus depends on the chemical composition of the film. The principal effect of UV illumination during cure on a film containing 0.05 mol citric acid per mol Si is to improve the modulus of a film that has been cured at 350° C. rather than 425° C. If no organic acid is present the modulus will be lower but the k value will be very substantially decreased. If a low k/low E recipe is used, e.g., one containing acetonitrile or propylene oxide, curing under UV light will increase k to that of a film made with a protic solvent such as ethanol, but will double or triple the Young's modulus. If a film treated by ammonia soft bake is cured under UV light, a very low dielectric constant (ca. 1.3) can be produced.

For example, a wafer spun with a sol corresponding to that described in section [0027] was soft baked for 10 min at 140° C. It was then loaded into a UV annealing apparatus (e.g., Axcelis Corp., Beverly, Mass.) and simultaneously illuminated with UV light at a wavelength of 200-300 nm and heated on a hot plate to 350° C. for 16 min. in a $N_2$ atmosphere. The Young's modulus of the film thusly prepared was 4.7 GPa. An identical wafer was treated with the same sol, soft baked, and annealed in the absence of UV at 350° C. for 16 min. The resulting film had a Young's modulus of 3.8 GPa.

For another example, a sol was made by combining 6.25 g each of TEOS and MTES with 18.0 g ethanol, 7.02 g 0.1 N $HNO_3$, and 3.87 g Pluronic P104 in the order stated. This sol was heated to 40 C for 1 hr, diluted in a 3:1 ratio with 2,2-EEE and spun onto a 8" silicon wafer at a speed of 800 rpm. The wafer was soft baked for 10 min. at 140° C., then exposed to a UV lamp with a wavelength in the range of 200-300 nm. It was simultaneously heated to 400° C. on a hot plate for a duration of 16 min. The k and E of the resulting film were 1.5 and 2.54 GPa, respectively.

For another example, a sol identical to the one employed in the previous example was spun onto a silicon wafer. The wafer was placed onto a ⅛" thick piece of Al metal 12" square, then covered with a bell jar, which was purged with N2 gas bubbled through aqueous $NH_3$. This assembly was placed on a hot plate and heated to 140 C for 10 min. The wafer was subsequently exposed to a UV lamp with a wavelength in the range of 200-300 nm and simultaneously heated to 400 C on a hot plate for a duration of 16 min. The k and E of the resulting film were 1.29 and 2.50 GPa, respectively.

In a further example, a sol was made by combining 6.25 g each of TEOS and MTES with 15.0 g acetonitrile, 3.0 g propylene oxide, 7.02 g 0.1 N $HNO_3$, and 2.58 g Pluronic P104 in the order stated. This sol was heated to 40 C for 1 hr, diluted in a 3:1 ratio with 2,2-EEE and spun onto a 8" silicon wafer at a speed of 800 rpm. The wafer was soft baked for 10 min. at 140° C., then exposed to a UV lamp with a wavelength in the range of 200-300 nm in a $N_2$ atmosphere. It was simultaneously heated to 400° C. on a hot plate for a duration of 16 min. The resulting k and E were 1.8 and 5.5 GPa, respectively. A wafer made identically without UV exposure during cure yielded a film with a k value of 1.7 and a modulus of 1.6 GPa. A similar increase of E results when the wafer is exposed to UV illumination during soft bake and is subsequently cured at 400° C., optimally under UV illumination but also in the dark.

As was previously mentioned, an inert gas must be used for curing dielectric films in a copper damascene process. Forming gas ($H_2$ diluted by $N_2$ or Ar) may be used in place of the inert gas. This will more completely remove the porogen and reduce k, though it will also reduce E. The films may also be annealed under vacuum instead of inert atmosphere.

Another improvement relates to increasing the degree of adhesion between the low-k film and the substrate. The substrate is typically capped with a Si or Ta nitride layer prior to film deposition. The adhesion of the low-k film to the nitride layer improves if the latter is partially oxidized to yield 1 or more monolayers of native oxide. $O_2$ plasma ashing, $O_2$ RIE, UV-ozone, and oxidizing chemical solutions such as $H_2SO_4/H_2O_2$ ("pirhana") accomplish this. Adhesion is further enhanced if a silane coupling agent is used subsequent to growth of a native oxide. This silane coupling agent introduces a chemical bond between the oxide and the film. Agents include hexamethyldisiloxane, which can be applied from solution or the vapor phase, and bipodal ligands, which are typically applied from solutions. In addition, silane coupling agents such as APTES (3-aminopropyl triethoxysilane) can treat the cured low-k film and improve its adhesion to copper.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims.

The invention claimed is:

1. A fluid colloidal solution comprising a silica source; a polar solvent; a co-solvent; water; an acid catalyst; and an amphiphilic block copolymer surfactant that makes the fluid colloidal solution lyotropic, wherein the fluid colloidal solution forms an oxide-polymer nanocomposite while drying, and wherein the co-solvent is 2-(2-ethoxy)ethoxyethanol or dipropylene glycol methyl ether, and the acid catalyst is squaric acid.

2. The fluid colloidal solution of claim 1 including a reactive solvent.

3. The fluid colloidal solution of claim 2 in which the reactive solvent is propylene oxide.

4. The fluid colloidal solution of claim 1 in which the amphiphilic block copolymer is a PEO-PPO-PEO triblock copolymer.

5. The fluid colloidal solution of claim 1 in which the silica source is an orthosilicate ester alone or in combination with an alkylated orthosilicate ester.

6. The fluid colloidal solution of claim 5 in which the orthosilicate ester is TEOS.

7. The fluid colloidal solution of claim 5 in which the alkylated orthosilicate ester is selected from MTES or VTES.

8. The fluid colloidal solution of claim 1 in which the silicon source is a silicone.

9. The fluid colloidal solution of claim 8 in which the silicone is an ethoxy-terminated poly(dimethylsiloxane).

10. The fluid colloidal solution of claim 1 containing an adhesion promoter that improves adhesion of the cured film to a substrate.

11. The fluid colloidal solution of claim 10 in which the adhesion promoter is a silane coupling agent.

12. The fluid colloidal solution of claim 10 in which the substrate is copper, silicon, silicon nitride, or silicon carbide.

13. The fluid colloidal solution of claim 1 which has a shelf life at ambient storage temperature of at least 6 months.

14. A film formed from the colloidal solution of claim 1 by spin coating, dip coating, draw coating, spray coating, or inkjet printing onto a substrate.

15. The film of claim 14 where the substrate is a silicon wafer.

16. A film of claim 14 that has been soft baked at 130-150° C.

17. A film of claim 16 that has been soft baked at 140° C.

18. A film of claim 17 that can be stored for a period between 4 hours and indefinitely before annealing without degrading the final properties of the annealed film.

19. The film of claim 14 where the film is compatible with plasma processing.

20. The film of claim 14 where the film is insensitive to atmospheric moisture.

21. The film of claim 14 where the film is resistant to damage caused by ash.

22. A dielectric film obtained by the method comprising combining a silica source, polar solvent, water, acid catalyst, polymer surfactant, and cosolvent to form a single component fluid colloidal solution, and depositing the fluid colloidal solution onto a surface under conditions whereby to form a low dielectric film, wherein the fluid colloidal solution forms an oxide-polymer nanocomposite while drying, and wherein the co-solvent is 2-(2-ethoxy)ethoxyethanol or dipropylene glycol methyl ether, the acid catalyst is squaric acid, and the polymer surfactant makes the fluid colloidal solution lyotropic.

23. A dielectric film obtained by the method comprising combining a silica source with a polar solvent to form a part A; separately combining water, an acid catalyst, and a polymer surfactant with a polar solvent to form a part B; mixing part A and part B to form a fluid colloidal solution; and depositing the fluid colloidal solution onto a surface under conditions whereby to form a low dielectric film, wherein the fluid colloidal solution forms an oxide-polymer nanocomposite while drying, and wherein the acid catalyst is squaric acid, and the polymer surfactant makes the fluid colloidal solution lyotropic.

24. The solution of claim 5, wherein the silica source comprises TEOS alone or in combination with ETES or VTES, or comprises TEOS and MTES either by themselves or in combination with ETES or DMDS.

25. An annealed film formed by annealing the film of claim 14 between 350° C. and 450° C. in air, $CO_2$, $N_2$, vacuum, Ar, He, or another inert gas.

26. The film of claim 14, annealed in the presence of UV illumination or electron beam irradiation.

27. The film of claim 14, annealed in an atmosphere containing $H_2$ at a temperature between 200° C. and 500° C.

28. The film of claim 23, wherein the method further comprises adding a co-solvent of 2-(2-ethoxy)ethoxyethanol or dipropylene glycol methyl ether to the mixture of parts A and B.

29. The solution of claim 24, further consisting of ETES or DMDS when the silica source is TEOS with MTES.

* * * * *